US012751183B2

(12) United States Patent
Hwang et al.

(10) Patent No.: US 12,751,183 B2
(45) Date of Patent: Sep. 29, 2026

(54) DISPLAY DEVICE AND METHOD OF MANUFACTURING THE SAME

(71) Applicant: SAMSUNG DISPLAY CO., LTD., Yongin-si (KR)

(72) Inventors: Sangyeon Hwang, Yongin-si (KR); Sangtae Ahn, Yongin-si (KR); Seunggun Chae, Yongin-si (KR); Jinho Hyun, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 428 days.

(21) Appl. No.: 18/471,578

(22) Filed: Sep. 21, 2023

(65) Prior Publication Data

US 2024/0188393 A1 Jun. 6, 2024

(30) Foreign Application Priority Data

Dec. 5, 2022 (KR) ........................ 10-2022-0167837

(51) Int. Cl.
*H10K 59/80* (2023.01)
*H10K 59/12* (2023.01)

(52) U.S. Cl.
CPC ..... *H10K 59/8731* (2023.02); *H10K 59/1201* (2023.02)

(58) Field of Classification Search
CPC .......................... H10K 59/731; H10K 59/1201
See application file for complete search history.

(56) References Cited

U.S. PATENT DOCUMENTS 12,069,908 B2 * 8/2024 So ...................... H10K 59/8722

FOREIGN PATENT DOCUMENTS

KR 10-2017-0116302 10/2017

* cited by examiner

*Primary Examiner* — Joseph L Williams
(74) *Attorney, Agent, or Firm* — F. CHAU & ASSOCIATES, LLC

(57) ABSTRACT

A display device includes a base substrate including a display area and a peripheral area positioned outside the display area, an organic insulating layer disposed on the display area of the base substrate, a light emitting device disposed on the organic insulating layer, a first dam disposed on the peripheral area of the base substrate and spaced apart from the organic insulating layer, and a pattern disposed on the peripheral area of the base substrate and positioned outside a region enclosed by the first dam.

17 Claims, 22 Drawing Sheets

DISPLAY DEVICE AND METHOD OF MANUFACTURING THE SAME

This application claims priority to Korean Patent Application No. 10-2022-0167837, filed on Dec. 5, 2022, and all the benefits accruing therefrom under 35 U.S.C. § 119, the content of which in its entirety is herein incorporated by reference.

BACKGROUND

1. Field

The disclosure relates to a display device and a method of manufacturing the display device. More specifically, the disclosure relates to a display device with improved manufacturing process efficiency and a manufacturing method of the display device.

2. Description of the Related Art

As information technology develops, importance of a display device as a connection medium between a user and information is being highlighted. For example, the use of display devices such as a liquid crystal display device (LCD), an organic light emitting display device (OLED), a plasma display device (PDP), and a quantum dot display device is increasing.

Meanwhile, in a process of manufacturing the display device, a protective film may be formed to temporarily protect pre-formed substructures until a subsequent process is completed. Accordingly, a step of removing the protective film may be desirable before the subsequent process.

SUMMARY

Embodiments provide a display device with improved manufacturing process efficiency.

Embodiments provide a method for manufacturing the display device.

According to an embodiment, a display device includes a base substrate including a display area and a peripheral area positioned outside the display area, an organic insulating layer disposed on the display area of the base substrate, a light emitting device disposed on the organic insulating layer, a first dam disposed on the peripheral area of the base substrate and spaced apart from the organic insulating layer, and a pattern disposed on the peripheral area of the base substrate and positioned outside a region enclosed by the first dam.

In an embodiment, the pattern may be disposed on a same layer as the first dam.

In an embodiment, the pattern may include an organic material.

In an embodiment, the pattern may include a same material as the first dam.

In an embodiment, the pattern may be integrally formed with the first dam and the pattern protrudes from an outer sidewall of the first dam.

In an embodiment, the pattern may be spaced apart from the first dam.

In an embodiment, the display device may further include a second dam spaced apart from the first dam. The first dam has a closed loop shape, and the second dam may be disposed in a region encircled by the closed loop shape of the first dam.

In an embodiment, the peripheral area may include a first peripheral area extending along a first straight line extending in a first direction, a second peripheral area extending along a second straight line extending in a second direction crossing the first direction, and a corner peripheral area connecting the first peripheral area to the second peripheral area, and the protrusion pattern may be disposed on the corner peripheral area of the base substrate.

In an embodiment, a planar shape of the pattern may be one of a circle, an ellipse, a polygon, and a curved shape in a form of a fan-shaped arc.

In an embodiment, the display device may further include an inorganic insulating layer disposed between the base substrate and the organic insulating layer, and the pattern may be disposed on a same layer as the inorganic insulating layer.

In an embodiment, the pattern may be integrally formed with the inorganic insulating layer.

In an embodiment, the display device may further include a first inorganic encapsulation layer disposed on the organic insulating layer and covering the light emitting device, an organic encapsulation layer disposed on the first inorganic encapsulation layer, covering the display area, and positioned inside an inner region encircled by the first dam, and a second inorganic encapsulation layer disposed on the organic encapsulation layer. The first inorganic encapsulation layer and the second inorganic encapsulation layer may extend beyond the first dam from the inner region encircled by the first dam.

In an embodiment, the first inorganic encapsulation layer and the second inorganic encapsulation layer may cover the pattern.

In an embodiment, the display device may further include a first inorganic encapsulation layer disposed on the organic insulating layer and covering the light emitting device, an organic encapsulation layer disposed on the first inorganic encapsulation layer, covering the display area, and positioned inside an inner region encircled by the first dam, and a second inorganic encapsulation layer disposed on the organic encapsulation layer. The first inorganic encapsulation layer and the second inorganic encapsulation layer extend to the first dam from the inner region encircled by the first dam. The pattern may be exposed from the first inorganic encapsulation layer and the second inorganic encapsulation layer.

In an embodiment, the pattern may have a height having a value selected from a range of about 1 micrometer to about 15 micrometer.

According to an embodiment, a method of manufacturing a display device includes forming a base substrate including a display area and a peripheral area positioned outside the display area on a carrier substrate, forming a pattern on the peripheral area of the base substrate, forming a light emitting device on the peripheral area of the base substrate, forming an encapsulation layer covering the light emitting device, forming a protective film on the base substrate to cover the protrusion pattern and the encapsulation layer, removing the carrier substrate from the base substrate, and removing the protective film disposed on the base substrate by peeling off a portion of the protective film covering the pattern and then peeling off another portion of the protective film covering the encapsulation layer.

In an embodiment, the method further comprises forming an organic insulating layer on the display area of the base substrate and forming a dam on the peripheral area of the base substrate. The dam is spaced apart from the organic insulating layer. The pattern is positioned outside a region encircled by the dam, and the forming of the dam is performed simultaneously with the forming of the organic insulating layer.

In an embodiment, the forming of the pattern may be simultaneously performed with the forming of the organic insulating layer and the forming of the dam.

In an embodiment, the pattern may be formed by an inkjet printing process.

In an embodiment, the protective film may be formed by an inkjet printing process.

According to an embodiment, a display device includes a base substrate, an organic insulating layer disposed on the base substrate, a light emitting device disposed on the organic insulating layer, a first dam encircling the organic insulating layer and spaced apart from the organic insulating layer, a second dam disposed on the base substrate, wherein the second dam is encircled by the first dam, wherein the organic insulating layer is encircled by the second dam, and wherein the second dam is disposed between the first dam and the organic insulating layer, and a pattern disposed on the base substrate and adjacent to an outer sidewall of the first dam, wherein a portion of the first dam is disposed between the pattern and the second dam.

The display device according to embodiments may include the dam surrounding the display area and at least one protrusion pattern positioned outside the dam. For example, the protrusion pattern may be disposed in the peripheral area (e.g., at least one selected from the corner peripheral area areas).

Also, according to the manufacturing method of the display device according to embodiments, the protective film temporarily formed to protect lower structures in the manufacturing process of the display device may be formed after the protrusion pattern is formed. Accordingly, the protective film may cover the protrusion pattern. That is, an edge of the protective film may be positioned outside the protrusion pattern.

Accordingly, an interface between the protrusion pattern and the protective film may be defined. Accordingly, since pressure is applied to the protective film to remove the protective film, stress may be generated at the interface, and deformation of the interface may be induced. Accordingly, a degree of peeling of the protective film may be improved. That is, a removal of the protective film may be facilitated, and an efficiency of the manufacturing process of the display device may be improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

FIG. 1-1 is a plan view illustrating a display device according to an embodiment.

DETAILED DESCRIPTION

Figure 1:
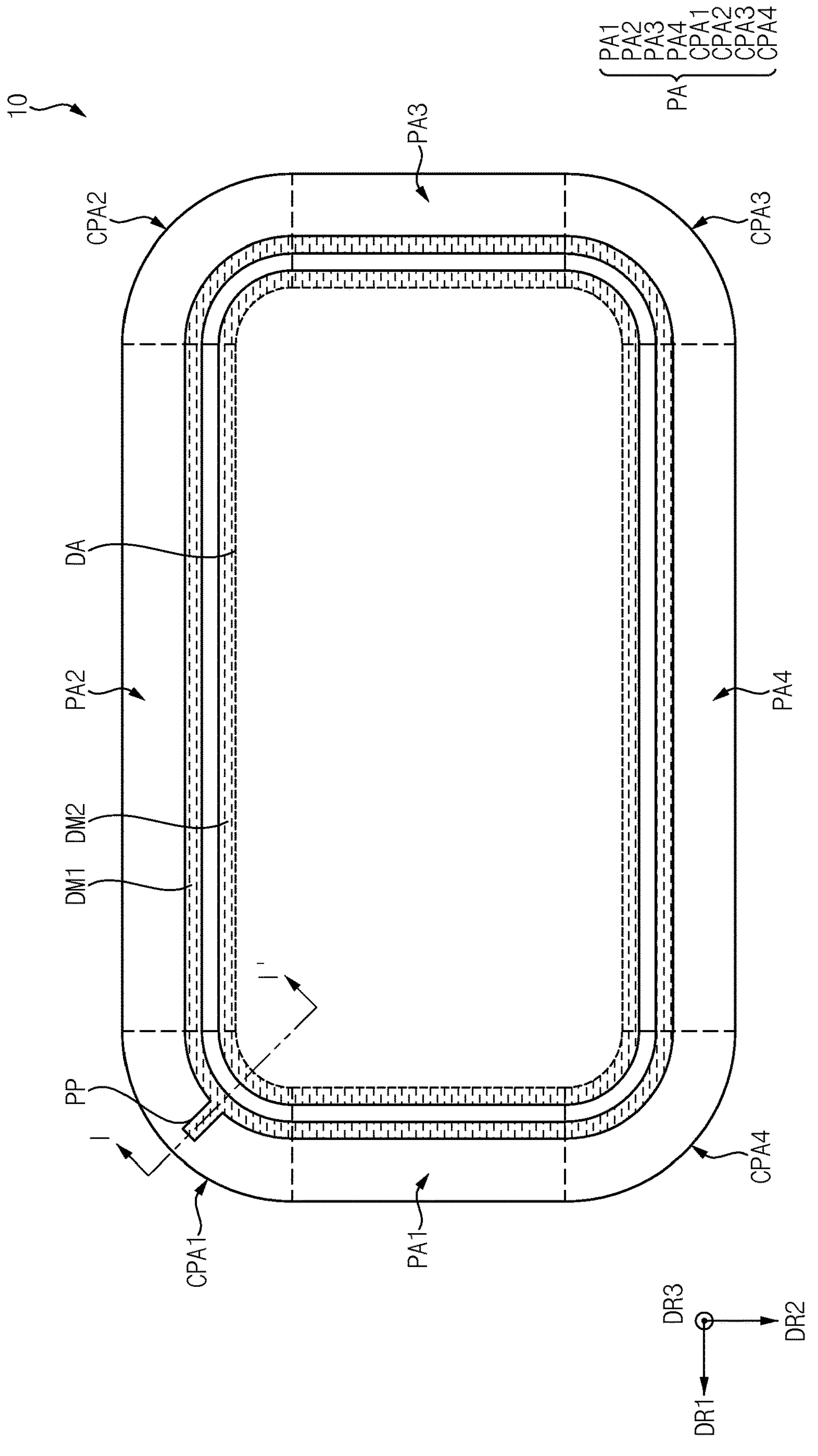
FIG. 1 is a plan view illustrating a display device according to an embodiment.
Figure 1:
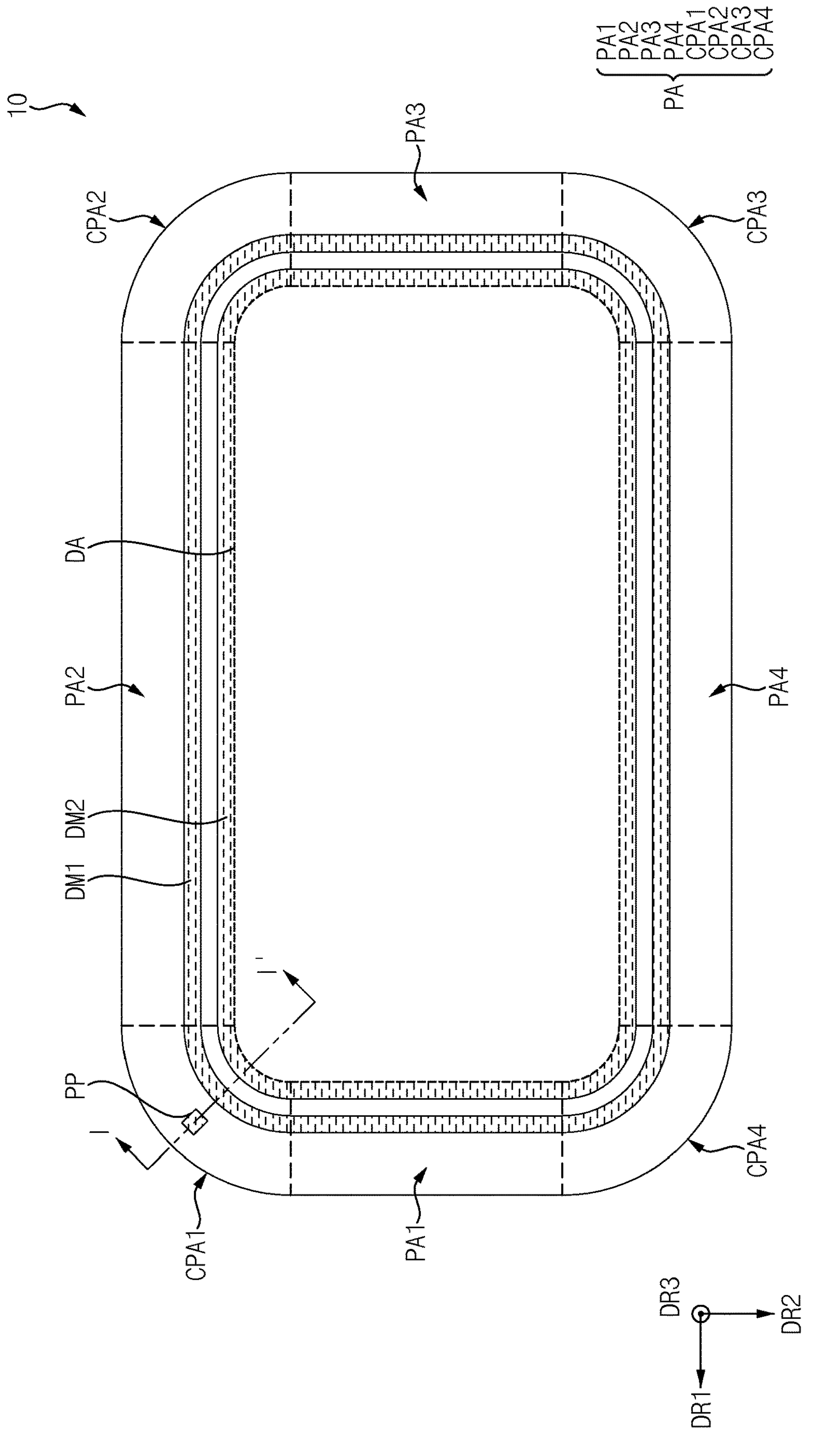

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

FIG. 1 is a plan view illustrating a display device according to an embodiment.

Referring to FIG. 1, a display device 10 (e.g., a base substrate 100 of FIG. 2) according to an embodiment may include a display area DA and a peripheral area PA. An image may be displayed in the display area DA. For example, the peripheral area PA may be positioned outside the display area DA. For example, the peripheral area PA may surround the display area DA.

A plurality of pixels may be disposed in the display area DA. For example, the pixels may be arranged in a matrix form along a first direction DR1 and a second direction DR2 crossing the first direction DR1. For example, the second direction DR2 may be perpendicular to the first direction DR1. Each of the pixels may include a transistor and a light emitting device. The light emitting device may generate light. For example, the light emitting device may include an organic light emitting diode.

In an embodiment, the display area DA may have a planar shape such as a circle, an ellipse, and a polygon. In FIG. 1, the display area DA may have a rectangular planar shape with rounded corners, but the present invention is not necessarily limited thereto. In this case, a plane may be defined from the first direction DR1 and the second direction DR2. A third direction DR3 may be perpendicular to the plane. The third direction DR3 may be referred to as a front direction of the display device 10.

The peripheral area PA may include first to fourth peripheral areas PA1, PA2, PA3, and PA4 and first to fourth corner peripheral areas CPA1, CPA2, CPA3, and CPA4.

The first to fourth peripheral areas PA1, PA2, PA3, and PA4 may be disposed on one side of the display area DA. For example, the first peripheral area PA1 and the third peripheral area PA3 may be disposed on opposite sides of the display area DA with the display area DA interposed therebetween, and may extend in the second direction DR2, respectively. In addition, the second peripheral area PA2 and the fourth peripheral area PA4 may be disposed on opposite sides with the display area DA interposed therebetween, and may extend in the first direction DR1, respectively.

The first to fourth corner peripheral areas CPA1, CPA2, CPA3, and CPA4 may be defined as corner portions of the peripheral area PA. The first corner peripheral area CPA1 may connect the first peripheral area PA1 and the second peripheral area PA2. The second corner peripheral area CPA2 may connect the second peripheral area PA2 and the third peripheral area PA3. The third corner peripheral area CPA3 may connect the third peripheral area PA3 and the fourth peripheral area PA4. The fourth corner peripheral area CPA4 may connect the fourth peripheral area PA4 and the first peripheral area PA1.

A first dam DM1 and a second dam DM2 may be disposed on the peripheral area PA. The second dam DM2 may surround the display area DA. In an embodiment, the second dam DM2 may have a closed loop shape, and the display area DA may be disposed in a region encircled by the closed loop shape of the second dam DM2. The first dam DM1 may surround the second dam DM2 and may be spaced apart from the second dam DM2. In an embodiment, the first dam DM1 may have a closed loop shape, and the second dam DM2 may be disposed in a region encircled by the closed loop shape of the first dam DM1. In an embodiment, the second dam DM2 may block an organic material of an encapsulation layer for sealing the display area DA from flowing outward from (i.e., flowing beyond) the second dam DM2.

A protrusion pattern PP (i.e., a pattern) may be disposed on the peripheral area PA. For example, the protrusion pattern PP may be disposed on at least one selected from the first to fourth corner peripheral areas CPA1, CPA2, CPA3, and CPA4. The protrusion pattern PP may be positioned outside the first dam DM1. In an embodiment, the first dam DM may have a closed loop shape, and the protrusion pattern PP may be positioned outside a region that is encircled by the closed loop shape of the first dam DM1. In an embodiment, the protrusion pattern PP may be integrally formed with the first dam DM1. For example, the protrusion pattern PP may protrude from an outer boundary of the first corner peripheral area CPA1. In an embodiment, the protrusion pattern PP may extend from an outer boundary of the first corner peripheral area CPA1 along a straight line extending in a radial direction of an imaginary circle overlapping the boundary of the first corner peripheral area CPA1.

In FIG. 1, one of the protrusion pattern PP is shown to be disposed on the first corner peripheral area CPA1, but the present invention is not necessarily limited thereto. In an embodiment, the protrusion pattern PP may be disposed on two or more corner peripheral areas among the first to fourth corner peripheral areas CPA1, CPA2, CPA3, and CPA4. Also, in an embodiment, two or more of the protrusion patterns PP may be disposed on one peripheral corner area.

In an embodiment, the protrusion pattern PP may be covered by a protective film for temporarily protecting pre-formed lower structures in a process of manufacturing the display device 10. The protective film may be removed by a peeling mechanism such as an adhesive roller. The protrusion pattern PP may improve a degree of peeling of the protective film. Therefore, the protective film may be more easily removed by the protrusion pattern PP. This will be described later in detail with reference to FIGS. 16 to 20.

Figure 2:
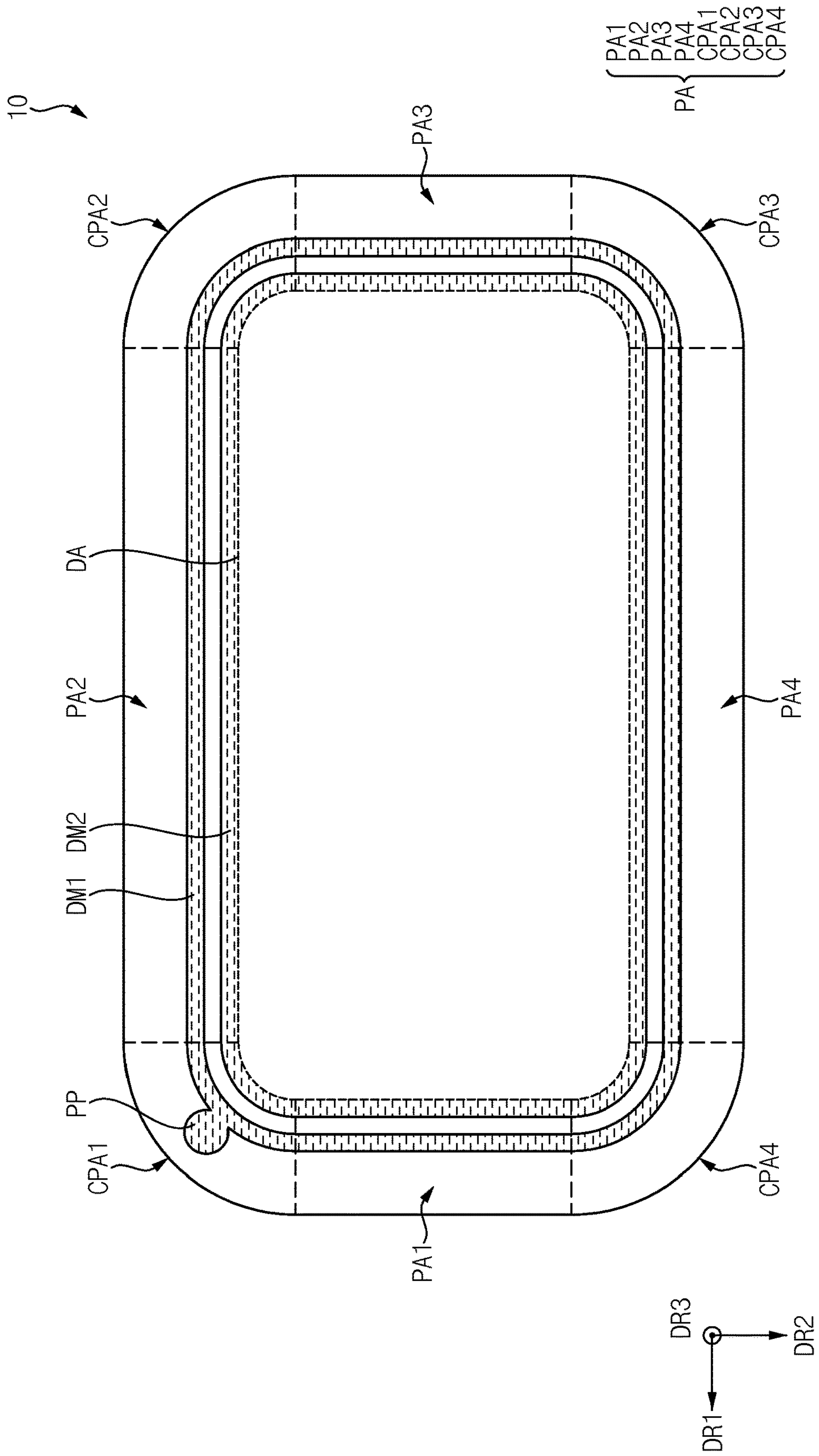
FIGS. 2 and 3 are plan views illustrating display devices according to embodiments.
Figure 3:
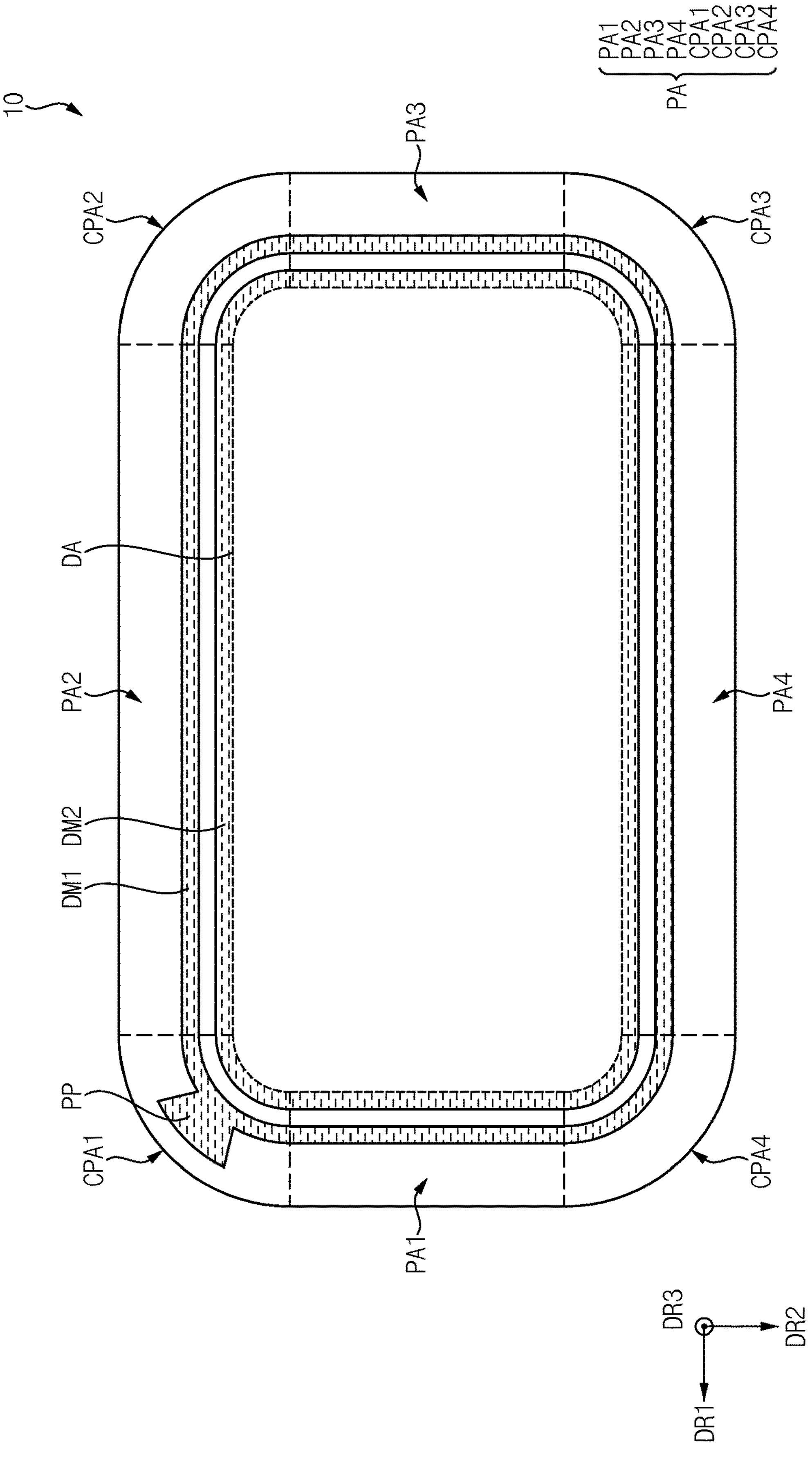

FIGS. 2 and 3 are plan views illustrating display devices according to embodiments. For example, FIGS. 2 and 3 are plan views illustrating various embodiments of a planar shape of the protrusion pattern PP.

Figure 4:
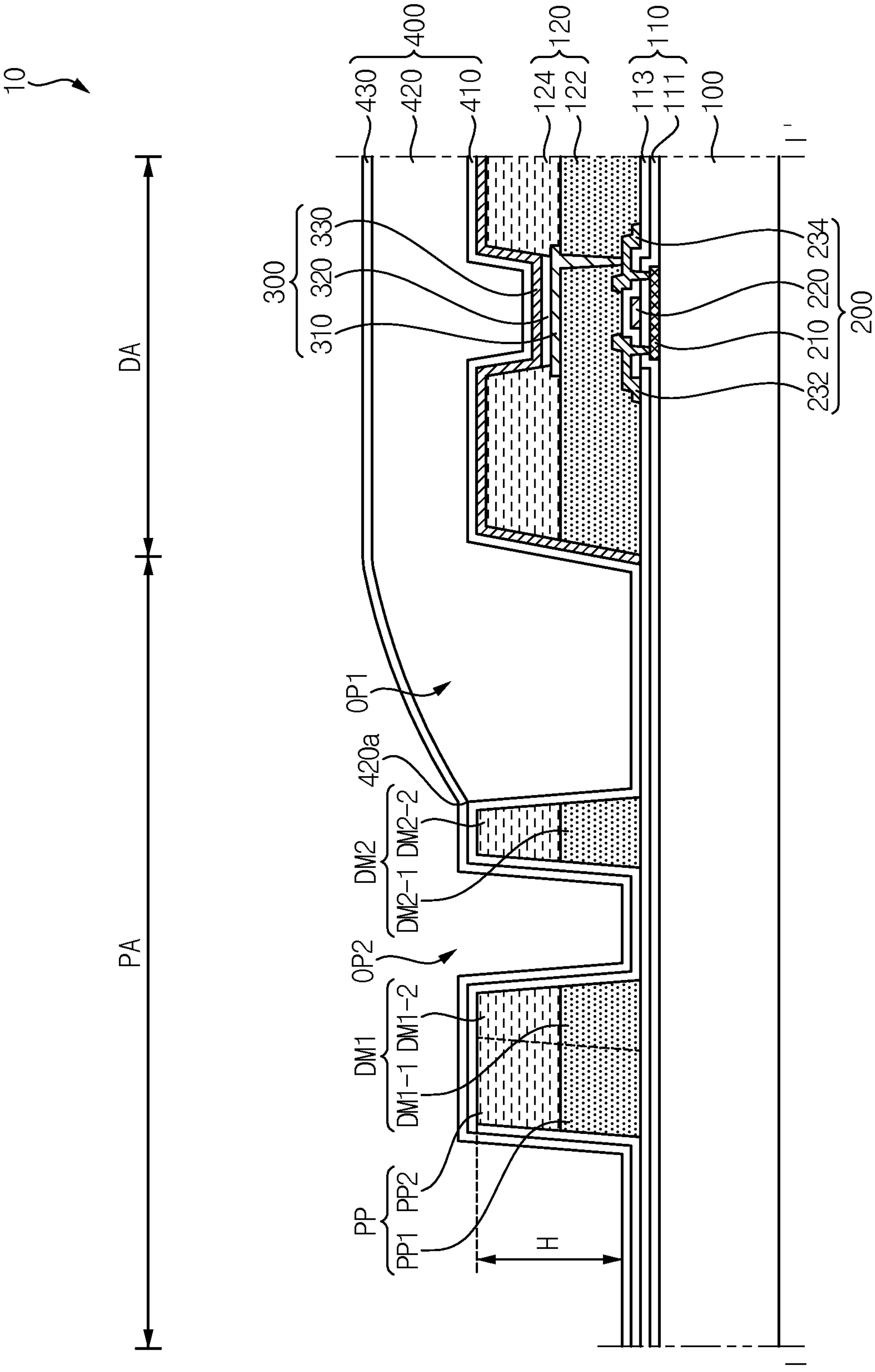
FIG. 4 is a cross-sectional view taken along the line I-I' of FIG. 1.

Referring to FIGS. 1 to 3, the planar shape of the protrusion pattern PP may vary. For example, as shown in FIG. 1, the planar shape of the protrusion pattern PP may be a rectangle. Also, as shown in FIG. 2, the planar shape of the protrusion pattern PP may be circle. Also, as shown in FIG. 3, the planar shape of the protrusion pattern PP may be a curved shape in a form of a fan-shaped arc. However, the present invention is not necessarily limited thereto, and the planar shape of the protrusion pattern PP may be an ellipse or a polygon other than a rectangle. FIG. 4 is a cross-sectional view taken along the line I-I' of FIG. 1.

Hereinafter, a cross-sectional structure of the display device 10 will be described in more detail with reference to FIGS. 1 and 4.

Referring to FIGS. 1 and 4, the display device 10 may include a base substrate 100, a transistor 200, a gate insulating layer 111, an interlayer insulating layer 113, a first organic insulating layer 122, a second organic insulating layer 124, a light emitting device 300, an encapsulation layer 400, the first dam DM1, the second dam DM2, and the protrusion pattern PP. For example, the transistor 200 may include an active pattern 210, a gate electrode 220, a source electrode 232, and a drain electrode 234. For example, the light emitting device 300 may include a pixel electrode 310, a light emitting layer 320, and a common electrode 330. For example, the encapsulation layer 400 may include a first inorganic encapsulation layer 410, an organic encapsulation layer 420, and a second inorganic encapsulation layer 430.

The base substrate 100 may include or may be a transparent insulating substrate. For example, the base substrate 100 may include or may be a flexible substrate formed of plastic or the like. As a specific example, the base substrate 100 may include or may be a polyimide (PI) substrate. The polyimide substrate may include a first polyimide layer, a barrier film layer, and a second polyimide layer. For example, the base substrate 100 may include or may be a glass substrate such as a quartz substrate, a synthetic quartz substrate, a calcium fluoride substrate, an F-doped quartz substrate, a soda-lime substrate, and a non-alkali glass substrates. The base substrate 100 may have the display area DA and the peripheral area PA. As described above, the peripheral area PA may include the first to fourth peripheral areas PA1, PA2, PA3, and PA4 and the first to fourth corner peripheral areas CPA1, CPA2, CPA3, and CPA4.

The active pattern 210 may be disposed on the display area DA of the base substrate 100. For example, the active pattern 210 may include or may be formed of a silicon semiconductor or an oxide semiconductor. The silicon semiconductor may include or may be formed of amorphous silicon, polycrystalline silicon, or the like. The active pattern 210 may include a source area, a drain area, and a channel area. Impurities may be doped into the source area and the drain area. The channel area may be disposed between the source area and the drain area.

In an embodiment, although not shown, a buffer layer may be disposed between the base substrate 100 and the active pattern 210. That is, the active pattern 210 may be disposed on the display area DA, and may be disposed on the buffer layer that is disposed on the display area DA. The buffer layer may prevent diffusion of impurities from the base substrate 100 to the active pattern 210. The buffer layer may include or may be formed of an inorganic insulating material. Examples of inorganic insulating materials that can be used as the buffer layer may include silicon oxide, silicon nitride, or silicon oxynitride. These may be used alone or in combination with each other.

The gate insulating layer 111 may be disposed on the base substrate 100. For example, the gate insulating layer 111 may be disposed on the display area DA and the peripheral area PA of the base substrate 100. In an embodiment, the gate insulating layer 111 may be entirely disposed on the display area DA and the peripheral area PA. The gate insulating layer 111 that is disposed on the display area DA may cover the active pattern 210 on the base substrate 100. In an embodiment, the gate insulating layer 111 may include or may be formed of an inorganic insulating material.

Examples of inorganic insulating materials that can be used as the gate insulating layer 111 may include silicon oxide, silicon nitride, or silicon oxynitride. These may be used alone or in combination with each other.

The gate electrode 220 may be disposed on the display area DA, and may be disposed on the gate insulating layer 111 that is disposed on the display area DA. The gate electrode 220 may overlap the channel area of the active pattern 210. The gate electrode 220 may include or may be formed of a metal, an alloy, a conductive metal oxide, a conductive metal nitride, a transparent conductive material, or the like.

The interlayer insulating layer 113 may be disposed on the gate insulating layer 111. For example, the interlayer insulating layer 113 may be disposed on the display area DA and the peripheral area PA, and may be disposed on the gate insulating layer 111 that is disposed on the display area DA and the peripheral area PA. In an embodiment, the interlayer insulating layer 113 may be entirely disposed on the display area DA and the peripheral area PA. The interlayer insulating layer 113 that is disposed on the display area DA may cover the gate electrode 220 on the gate insulating layer 111. In an embodiment, the interlayer insulating layer 113 may include or may be formed of an inorganic insulating material. Examples of inorganic insulating materials that can be used as the interlayer insulating layer 113 may include silicon oxide, silicon nitride, or silicon oxynitride. These may be used alone or in combination with each other.

The buffer layer, the gate insulating layer 111, and the interlayer insulating layer 113 may be referred to as an inorganic insulating layer 110. The inorganic insulating layer 110 may be disposed on the display area DA and the peripheral area PA. In an embodiment, the inorganic insulating layer 110 may be entirely disposed on the display area DA and the peripheral area PA. The inorganic insulating layer 110 may be interposed between the base substrate 100 and the first organic insulating layer 122.

The source electrode 232 and the drain electrode 234 may be disposed on the display area DA on the interlayer insulating layer 113. The source electrode 232 and the drain electrode 234 may be connected to the source area and the drain area of the active pattern 210, respectively. The source electrode 232 and the drain electrode 234 may include or may be formed of a metal, an alloy, a conductive metal oxide, a conductive metal nitride, a transparent conductive material, or the like. The active pattern 210, the gate electrode 220, the source electrode 232, and the drain electrode 234 may form the transistor 200. That is, the transistor 200 may be disposed at the display area DA of the base substrate 100.

The first organic insulating layer 122 may be disposed on the display area DA, and may be disposed on the interlayer insulating layer 113 that is disposed on the display area DA. The first organic insulating layer 122 may cover the transistor 200. For example, the first organic insulating layer 122 may be a planarization layer. The first organic insulating layer 122 may cover the source electrode 232 and the drain electrode 234 on the interlayer insulating layer 113. The first organic insulating layer 122 may have a substantially flat upper surface without creating a step around the source electrode 232 and the drain electrode 234. The first organic insulating layer 122 may include or may be formed of an organic insulating material. Examples of organic insulating materials that can be used as the first organic insulating layer 122 may include photoresist, polyacryl-based resin, polyimide-based resin, and polyamide-based resin, siloxane-based resin, acrylic-based resin, epoxy-based resin, or the like. These may be used alone or in combination with each other. Terms such as "same," "equal," "planar," and "coplanar," as used herein encompass near identicality including variations that may occur, for example, due to manufacturing processes. The term "substantially" may be used herein to emphasize this meaning, unless the context or other statements indicate otherwise.

The pixel electrode 310 may be disposed on the display area DA, and may be disposed on the first organic insulating layer 122 that is disposed on the display area DA. The pixel electrode 310 may be connected to the source electrode 232 or the drain electrode 234. That is, the pixel electrode 310 may be disposed on the transistor 200 and electrically connected to the transistor 200. The pixel electrode 310 may include or may be formed of a metal, an alloy, a conductive metal nitride, a transparent conductive material, or the like.

The second organic insulating layer 124 may be disposed on the display area DA, and may be disposed on the first organic insulating layer 122 that is disposed on the display area DA. For example, the second organic insulating layer 124 may be a pixel defining layer. The second organic insulating layer 124 may partially cover the pixel electrode 310 on the first organic insulating layer 122. The second organic insulating layer 124 may have a pixel opening exposing at least a portion of the pixel electrode 310. For example, the pixel opening may expose a central portion of the pixel electrode 310 and the second organic insulating layer 124 may cover a peripheral portion of the pixel electrode 310. The second organic insulating layer 124 may include or may be formed of an organic insulating material.

Examples of organic insulating materials that can be used as the second organic insulating layer 124 may include photoresist, polyacryl-based resin, polyimide-based resin, polyamide-based resin, siloxane-based resin, acrylic-based resin, epoxy-based resin, or the like. These may be used alone or in combination with each other.

The first organic insulating layer 122 and the second organic insulating layer 124 may be referred to as an organic insulating layer 120.

The light emitting layer 320 may be disposed on the pixel electrode 310 exposed by the pixel opening. That is, the light emitting layer 320 may be disposed within the pixel opening. The light emitting layer 320 may be disposed between the pixel electrode 310 and the common electrode 330. The light emitting layer 320 may include at least one selected from an organic light emitting material and a quantum dot.

The common electrode 330 may be disposed on the light emitting layer 320 and may overlap the pixel electrode 310. For example, the common electrode 330 may be disposed on the second organic insulating layer 124. In an embodiment, the common electrode 330 may be entirely disposed on the second organic insulating layer 124. The common electrode 330 may include or may be formed of a metal, an alloy, a conductive metal oxide, a conductive metal nitride, a transparent conductive material, or the like.

The pixel electrode 310, the light emitting layer 320 and the common electrode 330 may form the light emitting device 300. That is, the light emitting device 300 may be disposed on the display area DA of the base substrate 100.

The first dam DM1 and the second dam DM2 may be disposed on the peripheral area PA of the base substrate 100. As described above, when the organic encapsulation layer 420 is formed using an organic material such as a monomer, the first dam DM1 and the second dam DM2 may block the organic material from flowing outward from the first dam DM1 and the second dam DM2. Accordingly, the first dam DM1 and the second dam DM2 may prevent the organic material from overflowing toward the edge of the base substrate 100.

For example, the first dam DM1 may be disposed on the interlayer insulating layer 113 and spaced apart from the organic insulating layer 120. For example, the second dam DM2 may be disposed on the interlayer insulating layer 113, positioned inside the first dam DM1, and spaced apart from the first dam DM1. Also, the second dam DM2 may be spaced apart from the organic insulating layer 120. In an embodiment, the first dam DM1 may have a closed loop shape, and the second dam DM2 may be disposed in a region encircled by the closed loop shape of the first dam DM1.

In an embodiment, each of the first dam DM1 and the second dam DM2 may have a multilayer structure in which a plurality of layers are stacked. For example, the first dam DM1 may include a 1-1 dam DM1-1 and a 1-2 dam DM1-2, and the 1-2 dam DM1-2 may be disposed on the 1-1 dam DM1-1. The second dam DM2 may include a 2-1 dam DM2-1 and a 2-2 dam DM2-2, and the 2-2 dam DM2-2 may be disposed on the 2-1 dam DM2-1.

In an embodiment, the 1-1 dam DM1-1 and the 2-1 dam DM2-1 may be formed together with the first organic insulating layer 122. In other words, the 1-1 dam DM1-1 and the 2-1 dam DM2-1 may include or may be formed of a same material as the first organic insulating layer 122. In an embodiment, the 1-2 dam DM1-2 and the 2-2 dam DM2-2 may be formed together with the second organic insulating layer 124. In other words, the 1-2 dam DM1-2 and the 2-2 dam DM2-2 may include or may be formed of a same material as the second organic insulating layer 124.

In an embodiment, each of the first dam DM1 and the second dam DM2 may include or may be formed of an organic insulating material. Examples of organic insulating materials that can be used as the first dam DM1 and the second dam DM2 may include photoresist, polyacryl-based resin, polyimide-based resin, polyamide-based resin, siloxane-based resin, acryl-based resin, epoxy-based resin, or the like. These may be used alone or in combination with each other. In an embodiment, a first opening OP1 may be defined as a space between the organic insulating layer 120 and the second dam DM2. The first opening OP1 may separate the second dam DM2 from the organic insulating layer 120. A second opening OP2 may be defined in a space between the second dam DM2 and the first dam DM1. The second opening OP2 may separate the first dam DM1 from the second dam DM2.

The protrusion pattern PP may be disposed on the peripheral area PA of the base substrate 100. As described above, the protrusion pattern PP may improve the degree of peeling of the protective film for temporarily protecting pre-formed lower structures in the process of manufacturing the display device 10.

For example, the protrusion pattern PP may be disposed on the interlayer insulating layer 113 and may be positioned outside the first dam DM1. In an embodiment, the first dam DM1 may have a closed loop shape, and the protrusion pattern PP may be positioned outside a region that is encircled by the closed loop shape of the first dam DM1. In an embodiment, as shown in FIG. 4, the protrusion pattern PP may be integrally formed with the first dam DM1. For example, the protrusion pattern PP may contact an outer sidewall of the first dam DM1. However, the present invention is not necessarily limited thereto. The term "contact," as used herein, refers to a direct connection (i.e., physical touching) unless the context indicates otherwise.

In an embodiment, the protrusion pattern PP may have a multilayer structure in which a plurality of layers are stacked. For example, the protrusion pattern PP may include a first protrusion pattern PP1 and a second protrusion pattern PP2, and the second protrusion pattern PP2 may be disposed on the first protrusion pattern PP1.

In an embodiment, the first protrusion pattern PP1 may be formed together with the first organic insulating layer 122. That is, the first protrusion pattern PP1 may be formed together with the 1-1 dam DM1-1 and the 2-1 dam DM2-1. In other words, the first protrusion pattern PP1 may include or may be formed of a same material as the first organic insulating layer 122. That is, the first protrusion pattern PP1 may include or may be formed of a same material as the 1-1 dam DM1-1 and the 2-1 dam DM2-1. In an embodiment, the first protrusion pattern PP may be integrally formed with the 1-1 dam DM1-1.

In an embodiment, the second protrusion pattern PP2 may be formed together with the second organic insulating layer 124. That is, the second protrusion pattern PP2 may be formed together with the 1-1 dam DM1-2 and the 1-2 dam DM2-2. In other words, the second protrusion pattern PP2 may include or may be formed of a same material as the second organic insulating layer 124. That is, the second protrusion pattern PP2 may include or may be formed of a same material as the 1-2 dam DM1-2 and 2-2 dam DM2-2. In an embodiment, the second protrusion pattern PP2 may be integrally formed with the 1-2 dam DM1-2.

In an embodiment, the protrusion pattern PP may include or may be formed of an organic insulating material. Examples of organic insulating materials that can be used as the protrusion pattern PP may include photoresist, polyacryl-based resin, polyimide-based resin, polyamide-based resin, siloxane-based resin, acrylic-based resin, epoxy-based resin, or the like. These may be used alone or in combination with each other.

In an embodiment, a height H of the protrusion pattern PP may be about 1 micrometer to about 15 micrometer, specifically about 1 micrometer to about 10 micrometer. When the height H of the protrusion pattern PP satisfies the above range, the degree of peeling of the protective film by the protrusion pattern PP may be further improved. Terms such as "about" and "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The encapsulation layer 400 may be disposed on the common electrode 330. The encapsulation layer 400 may cover the light emitting device 300. The encapsulation layer 400 may encapsulate the display area DA to protect the light emitting device 300 from external impurities.

The encapsulation layer 400 may include or may be formed of at least one inorganic encapsulation layer and at least one organic encapsulation layer. For example, the encapsulation layer 400 may include the first inorganic encapsulation layer 410, the organic encapsulation layer 420, and the second inorganic encapsulation layer 430.

The first inorganic encapsulation layer 410 may be disposed on the common electrode 330. For example, the first inorganic encapsulation layer 410 may have a substantially uniform thickness along a profile of the common electrode 330.

In an embodiment, the first inorganic encapsulation layer 410 may be disposed on the display area DA and the peripheral area PA of the base substrate 100. That is, the first inorganic encapsulation layer 410 may cover the display area DA and may extend outside the first dam DM1. In an embodiment, the first inorganic encapsulation layer 410 may be entirely disposed on the display area DA and the peripheral area PA of the base substrate 100.

In an embodiment, the first inorganic encapsulation layer 410 may cover the protrusion pattern PP. For example, after the protrusion pattern PP is formed on the base substrate 100, the first inorganic encapsulation layer 410 may be formed on the base substrate 100. However, the present invention is not necessarily limited thereto. In an embodiment, after the protrusion pattern PP is formed on the base substrate 100, the first inorganic encapsulation layer 410 may be entirely formed on the base substrate 100.

The organic encapsulation layer 420 may be disposed on the first inorganic encapsulation layer 410 and may cover the display area DA. The organic encapsulation layer 420 may have a substantially flat upper surface without creating a step around the first inorganic encapsulation layer 410. In an embodiment, the organic encapsulation layer 420 may be positioned inside the second dam DM2. For example, as shown in FIG. 4, an edge 420*a* of the organic encapsulation layer 420 may be positioned on the second dam DM2. However, the present invention is not necessarily limited thereto. In an embodiment, the edge 420*a* of the organic encapsulation layer 420 may be positioned in the first opening OP1, the second opening OP2, or on the first dam DM1.

The second inorganic encapsulation layer 430 may be disposed on the organic encapsulation layer 420 and may be disposed on the display area DA and the peripheral area PA of the base substrate 100. That is, the second inorganic encapsulation layer 430 may cover the display area DA and may extend outside the first dam DM1. In an embodiment, the second inorganic encapsulation layer 430 may be entirely disposed on the display area DA and the peripheral area PA of the base substrate 100.

In an embodiment, the second inorganic encapsulation layer 430 may cover the protrusion pattern PP. For example, after the protrusion pattern PP is formed on the base substrate 100, the second inorganic encapsulation layer 430 may be formed on the base substrate 100. However, the present invention is not necessarily limited thereto. In an embodiment, after the protrusion pattern PP is formed on the base substrate 100, the second inorganic encapsulation layer 430 may be entirely formed on the base substrate 100.

According to embodiments, the display device 10 may include at least one protrusion pattern PP positioned outside the first dam DM1. For example, the protrusion pattern PP may be disposed on the peripheral area (e.g., at least one selected from the first to fourth corner peripheral areas CPA1, CPA2, CPA3, and CPA4) of the base substrate 100. Accordingly, the protrusion pattern PP may be covered by the protective film temporarily formed during the manufacturing process of the display device 10. That is, an interface between the protrusion pattern PP and the protective film may be defined. Accordingly, since pressure is applied to the protective film to remove the protective film, stress may be generated at the interface, and deformation of the interface may be induced. Accordingly, the degree of peeling of the protective film may be improved. That is, removal of the protective film may be facilitated, and efficiency of the manufacturing process of the display device 10 may be improved.

FIGS. 5 to 8 are cross-sectional views illustrating display devices according to embodiments.

For example, FIGS. 5 to 8 may correspond to the cross-sectional view of FIG. 4. Hereinafter, display devices according to embodiments will be described with reference to FIGS. 5 to 8. In following description, differences from the display device as described with reference to FIG. 4 will be mainly described, and overlapping descriptions will be omitted or simplified.

Figure 5:
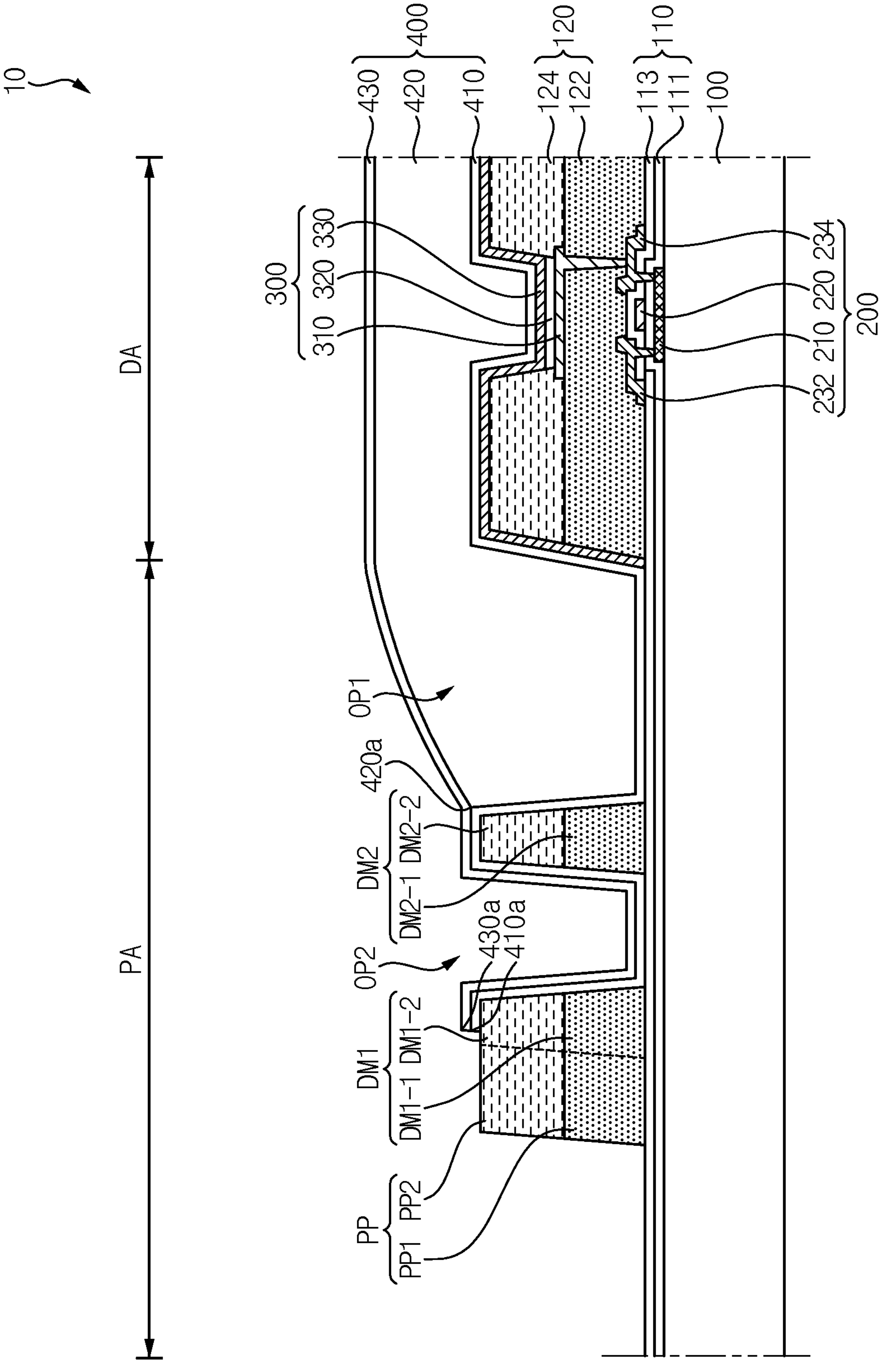
FIGS. 5 to 8 are cross-sectional views illustrating display devices according to embodiments.

Referring to FIG. 5, in an embodiment, the first inorganic encapsulation layer 410 and the second inorganic encapsulation layer 430 may expose the protrusion pattern PP. That is, the first inorganic encapsulation layer 410 and the second inorganic encapsulation layer 430 may not cover the protrusion pattern PP. For example, an edge 410*a* of the first inorganic encapsulation layer 410 and an edge 430*a* of the second inorganic encapsulation layer 430 may be positioned on the first dam DM1. However, the present invention is not necessarily limited thereto.

Figure 6:
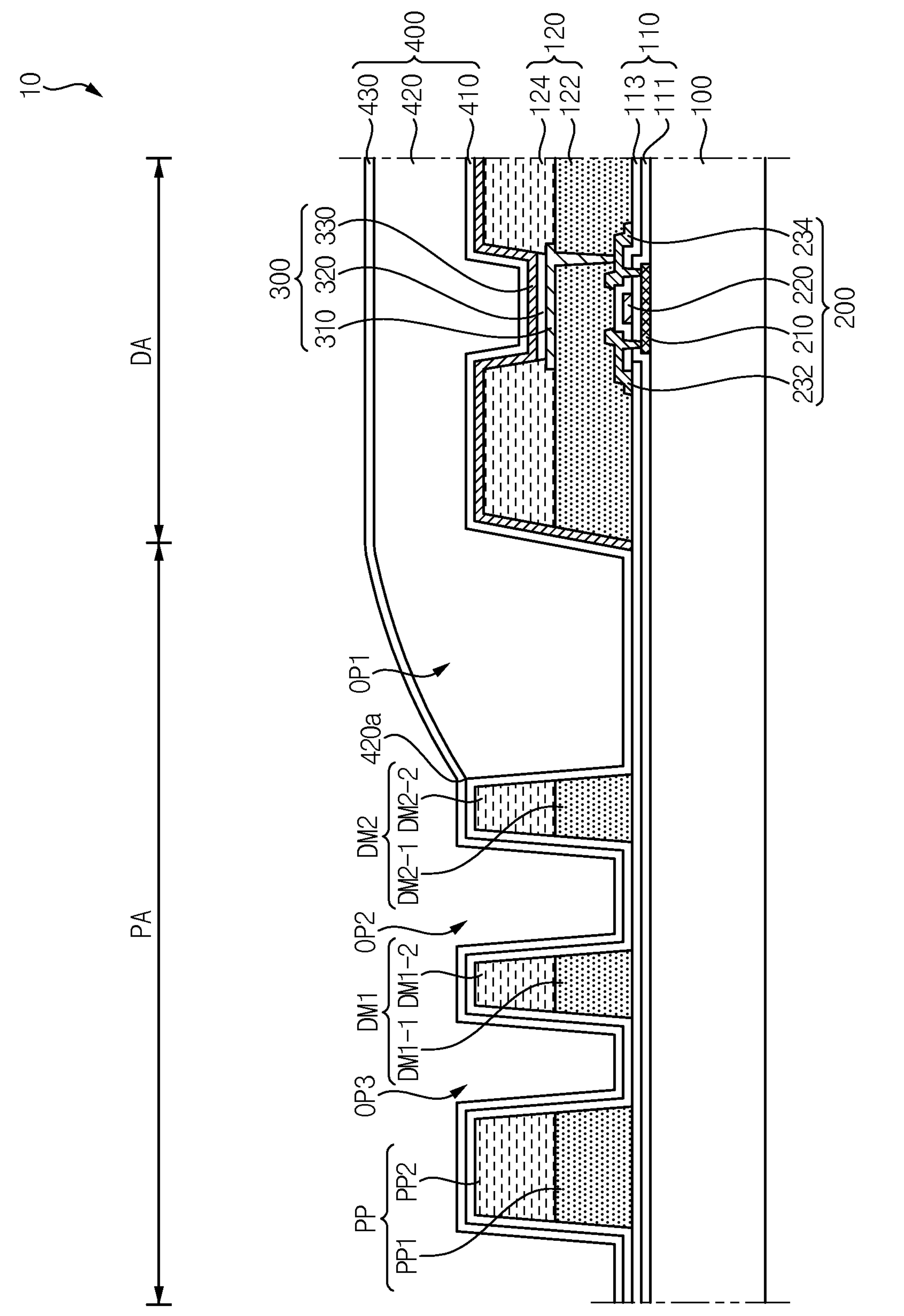

FIG. 6 is a cross-sectional view taken along line I-I' of FIG. 1-1. Referring to FIGS. 1-1 and 6, in an embodiment, the protrusion pattern PP may be spaced apart from the first dam DM1. For example, the protrusion pattern PP may be disposed on the interlayer insulating layer 113, positioned outside the first dam DM1, and spaced apart from the first dam DM1. In an embodiment, the first dam DM1 may have a closed loop shape, and the protrusion pattern PP may be positioned outside a region that is encircled by the closed loop shape of the first dam DM1. The protrusion pattern PP may be separated from the first dam DM1.

Here, a third opening OP3 may be defined as a space between the protrusion pattern PP and the first dam DM1. Accordingly, deformation of the interface between the protective film and the protrusion pattern PP may be more easily induced in a process of peeling the protective film. Accordingly, the degree of peeling of the protective film may be further improved. Accordingly, the efficiency of the manufacturing process of the display device 10 may be further improved.

Figure 7:
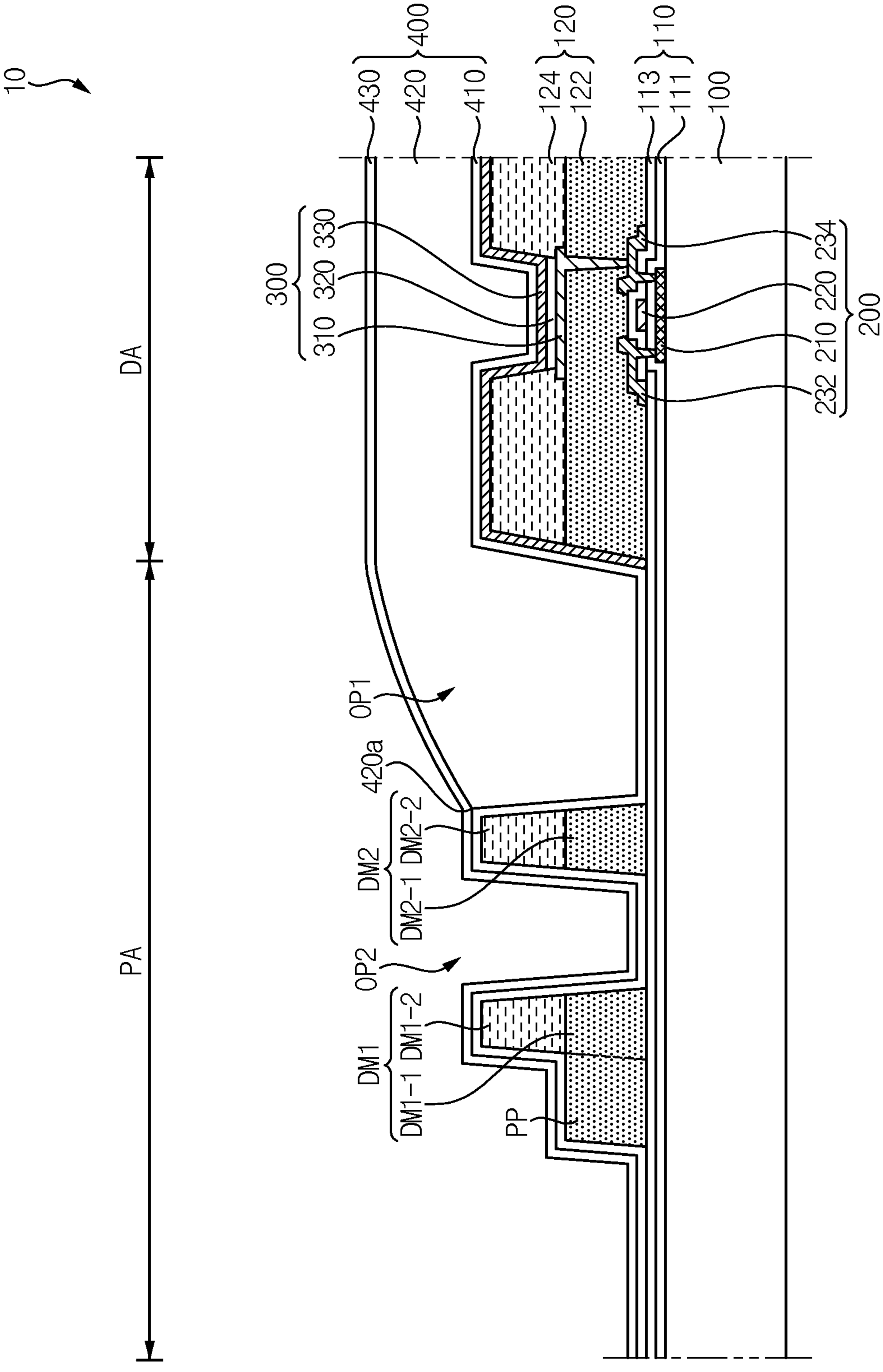

Referring to FIG. 7, in an embodiment, the protrusion pattern PP may have a single-layer structure. For example, the protrusion pattern PP may be formed together with the 1-2 dam DM1-2. In an embodiment, as shown in FIG. 7, the protrusion pattern PP may be integrally formed with the 1-2 dam DM1-2. For example, the protrusion pattern PP may contact an outer sidewall of the 1-2 dam DM1-2. However, the present invention is not necessarily limited thereto, and the protrusion pattern PP may be positioned outside the first dam DM1 and spaced apart from the first dam DM1.

Figure 8:
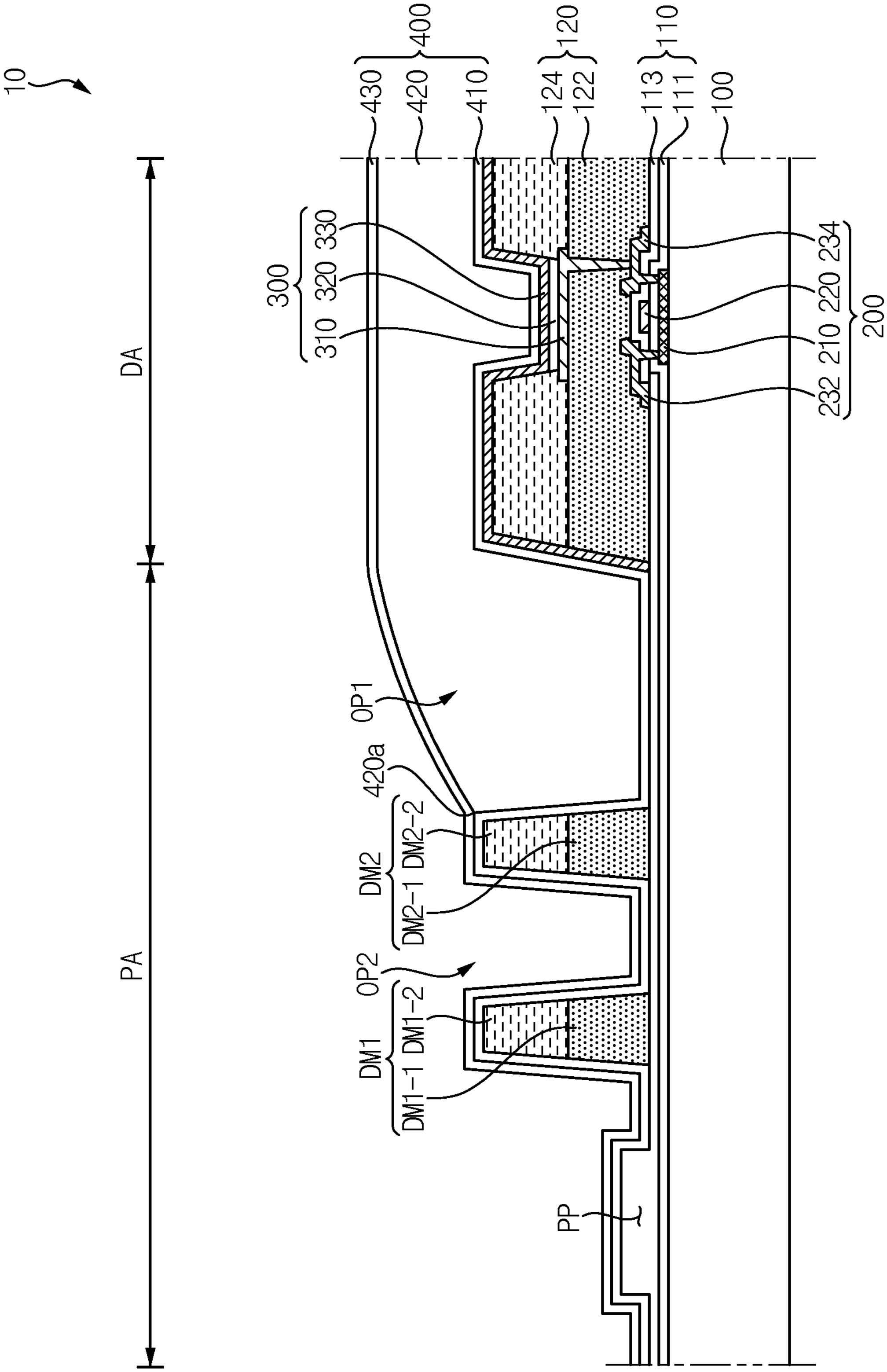

Referring to FIG. 8, the protrusion pattern PP may be disposed on a same layer as the inorganic insulating layer 110. In other words, the protrusion pattern PP may be formed together with the inorganic insulating layer 110. In an embodiment, the protrusion pattern PP may be integrally formed with the inorganic insulating layer 110. That is, the protrusion pattern PP may be defined as a portion of the inorganic insulating layer 110 positioned in the peripheral area PA which relatively protrudes toward the front direction of the display device 10 (e.g., in the third direction DR3 of FIG. 1). For example, as shown in FIG. 8, the protrusion pattern PP may be a portion of the interlayer insulating layer 113 positioned in the peripheral area PA which relatively protrudes toward the front direction of the display device 10. Also, in an embodiment, the protrusion pattern PP may be a portion of the gate insulating layer 111 positioned in the peripheral area PA which relatively protrudes toward the front direction of the display device 10, or may be a portion of the buffer layer which relatively protrudes toward the front direction of the display device 10.

FIGS. 9 to 20 are cross-sectional views illustrating a method of manufacturing a display device according to an embodiment. Specifically, FIGS. 17 and 18 may be cross-sectional views taken along line II-II' of FIG. 16.

For example, FIGS. 9 to 20 may be cross-sectional views illustrating a manufacturing method of the display device 10 of FIG. 4. Hereinafter, a manufacturing method of the display device 10 of FIG. 4 will be described with reference to FIGS. 9 to 20.

Figure 9:
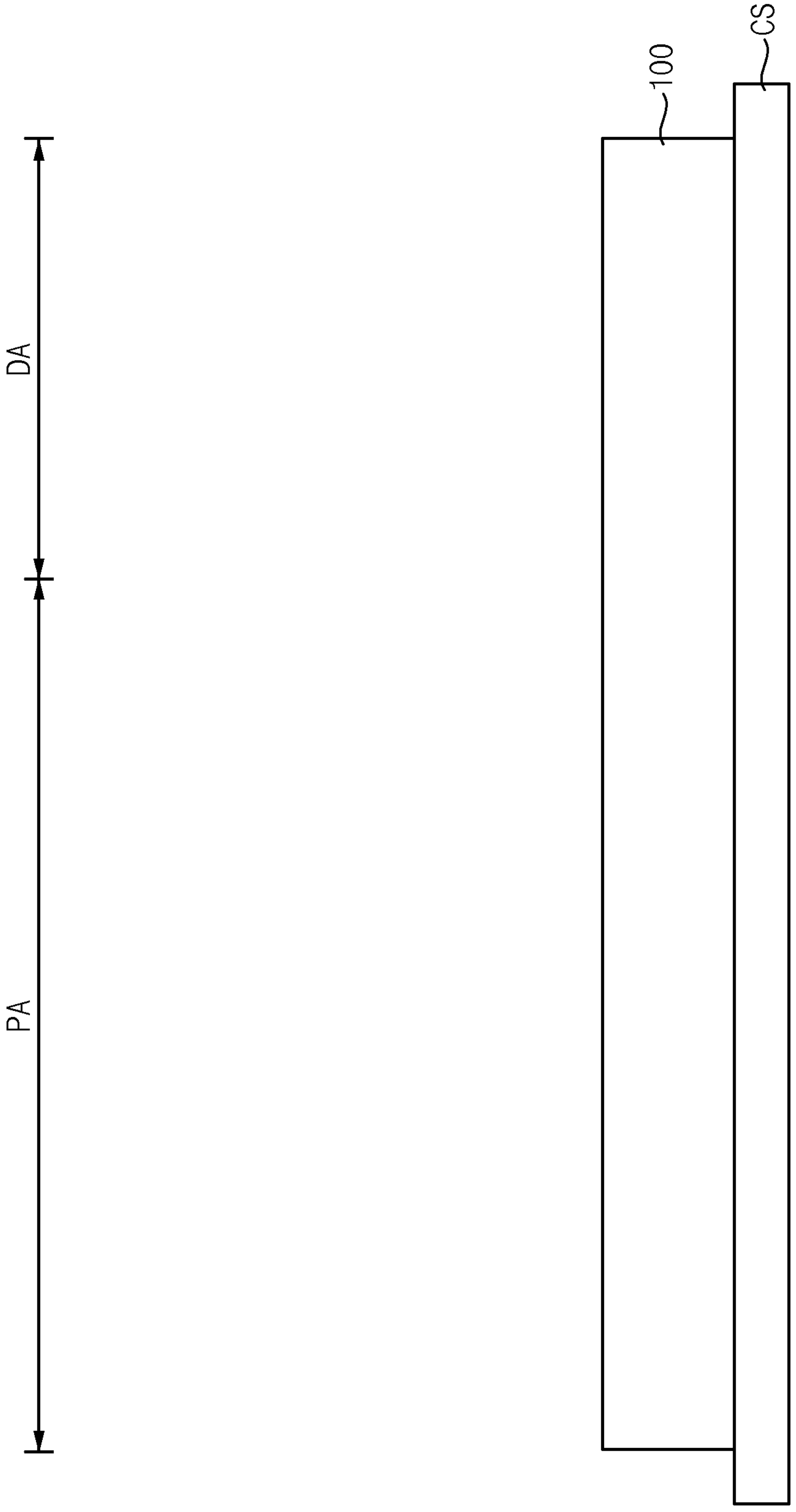
FIGS. 9 to 20 are cross-sectional views illustrating a method of manufacturing a display device according to an embodiment.

Referring to FIG. 9, the base substrate 100 including the display area DA and the peripheral area PA may be formed on a carrier substrate CS. In an embodiment, the base substrate 100 may include or may be formed of polyimide. In an embodiment, the base substrate 100 may include or may be formed of glass, quartz, or the like.

Figure 10:
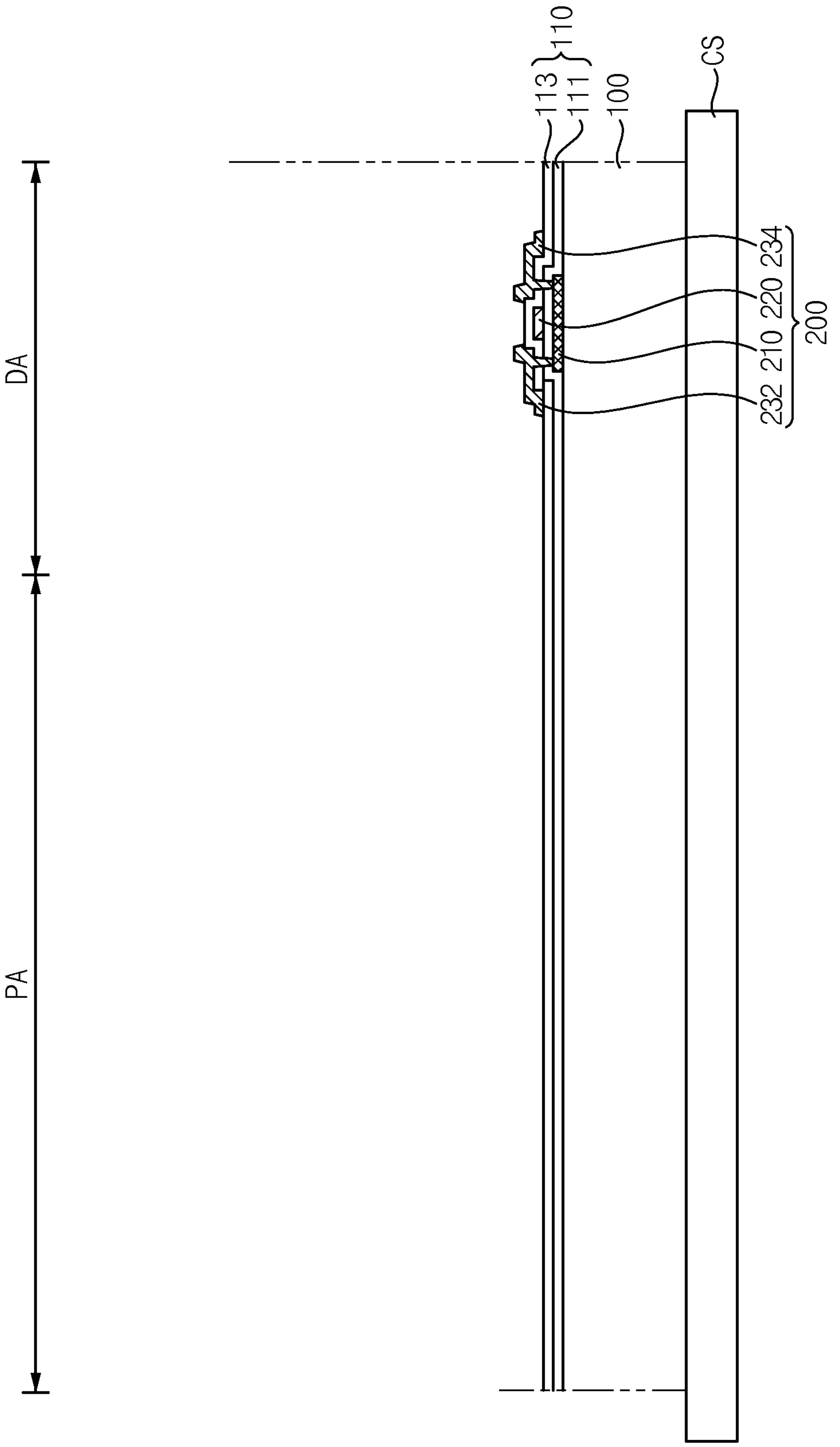

Referring to FIG. 10, the active pattern 210 may be formed on the display area DA of the base substrate 100. For example, the active pattern 210 may include or may be formed of amorphous silicon, polycrystalline silicon, or an oxide semiconductor.

The gate insulating layer 111 may be formed on the base substrate 100 and the active pattern 210. In an embodiment, the gate insulating layer 111 may be formed on the display area DA and the peripheral area PA of the base substrate 100. In an embodiment, the gate insulating layer 111 may be entirely formed on the display area DA and the peripheral area PA of the base substrate 100. The gate insulating layer 111 may include or may be formed of an inorganic insulating material.

The gate electrode 220 may be formed on the display area DA, and may be disposed on the gate insulating layer 111. The gate electrode 220 may be formed to overlap the channel area of the active pattern 210. For example, the gate electrode 220 may include or may be formed of a metal, an alloy, a conductive metal oxide, a conductive metal nitride, a transparent conductive material, or the like.

The interlayer insulating layer 113 may be formed on the gate insulating layer 111 and the gate electrode 220. In an embodiment, the interlayer insulating layer 113 may be formed on the display area DA and the peripheral area PA, and may be formed on the gate insulating layer 111. In an embodiment, the interlayer insulating layer 113 may be entirely formed on the display area DA and the peripheral area PA, and may be entirely formed on the gate insulating layer 111. The interlayer insulating layer 113 may include or may be formed of an inorganic insulating material.

Contact holes may be formed in the gate insulating layer 111 and the interlayer insulating layer 113 to overlap the source area and the drain area of the active pattern 210. For example, the contact holes may penetrate the gate insulating layer 111 and the interlayer insulating layer 113 to expose the source area and the drain area of the active pattern 210. In addition, the source electrode 232 and the drain electrode 234 may be formed on the interlayer insulating layer 113 to overlap each of the contact holes. The source electrode 232 and the drain electrode 234 may be respectively connected to the source area and the drain area of the active pattern 210 through each of the contact holes. Accordingly, the transistor 200 including the active pattern 210, the gate electrode 220, the source electrode 232, and the drain electrode 234 may be formed on the display area DA of the base substrate 100.

Figure 11:
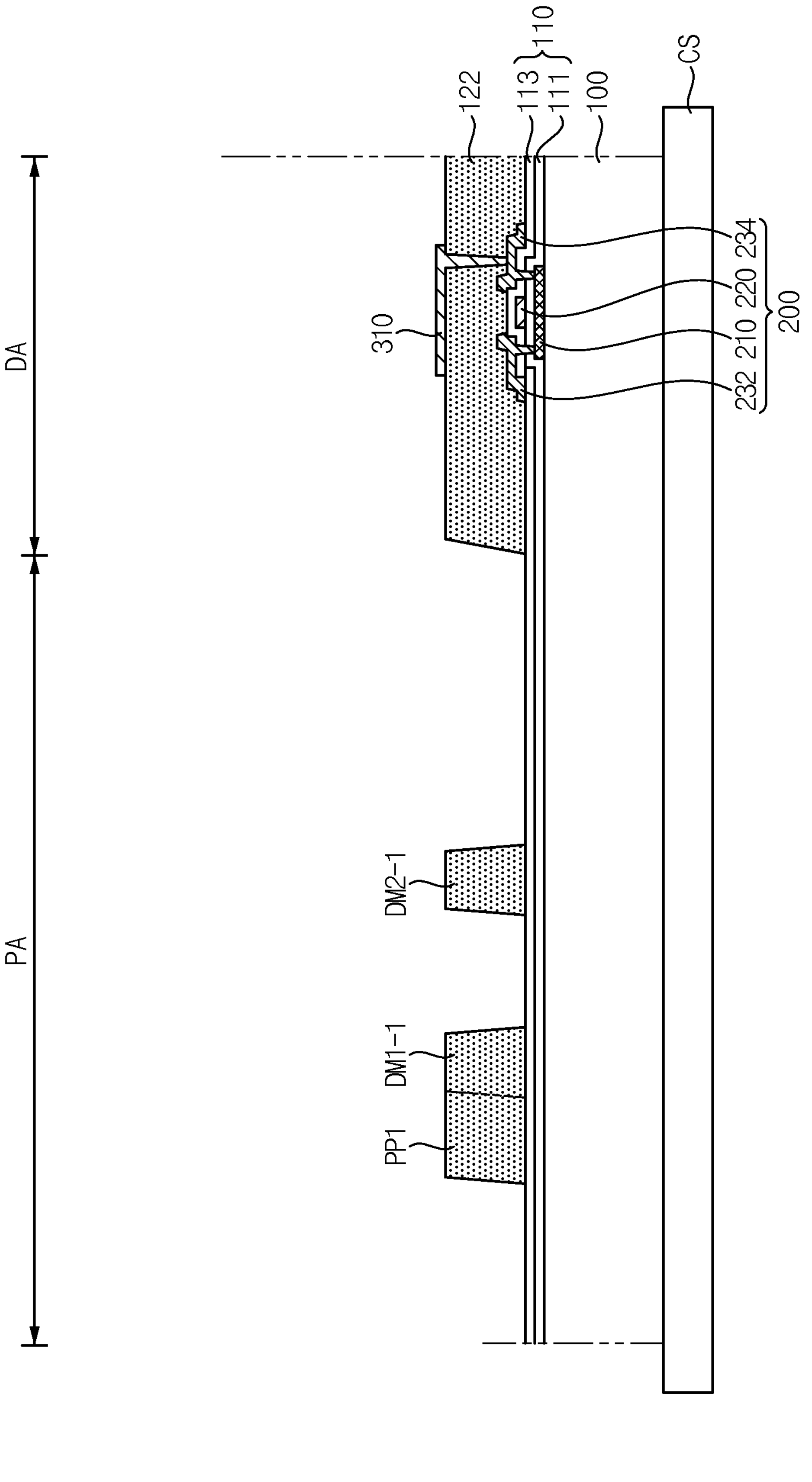

Referring to FIG. 11, the first organic insulating layer 122 covering the transistor 200 may be formed on the display area DA of the base substrate 100. The first organic insulating layer 122 may cover the interlayer insulating layer 113, the source electrode 232 and the drain electrode 234.

The 1-1 dam DM1-1, the 2-1 dam DM2-1, and the first protrusion pattern PP1 may be formed on the peripheral area PA of the base substrate 100. In an embodiment, the 2-1 dam DM2-1 may be positioned outside the first organic insulating layer 122 and spaced apart from the first organic insulating layer 122. In an embodiment, the 2-1 dam DM2-1 may have a closed loop shape, and the first organic insulating layer 122 may be disposed in a region enclosed by the closed loop shape of the 2-1 dam DM2-1. The 1-1 dam DM1-1 may be positioned outside the 2-1 dam DM2-1 and spaced apart from the 2-1 dam DM2-1. In an embodiment, the 1-1 dam DM1-1 may have a closed loop shape, and the 2-1 dam DM2-1 may be disposed in a region enclosed by the closed loop shape of the 1-1 dam DM1-1. The first protrusion pattern PP1 may be positioned outside the 1-1 dam DM1-1 and integrally formed with the 1-1 dam DM1-1. For example, the first protrusion pattern PP1 may contact an outer sidewall of the 1-1 dam DM1-1.

In an embodiment, the first organic insulating layer 122, the 1-1 dam DM1-1, the 2-1 dam DM2-1, and the first protrusion pattern PP1 may be formed together. For example, by applying a first preliminary organic insulating layer on the base substrate 100 and patterning the first preliminary organic insulating layer, the first organic insulating layer 122, the 1-1 dam DM1-1, the 2-1 dam DM2-1, and the first protrusion pattern PP1 may be formed. The first organic insulating layer 122, the 1-1 dam DM1-1, the 2-1 dam DM2-1, and the first protrusion pattern PP1 may include or may be formed of an organic insulating material.

A contact hole may be formed in the first organic insulating layer 122. The contact hole may expose at least a portion of an upper surface of the drain electrode 234. For example, the contact hole may penetrate the first organic insulating layer to expose a portion of the upper surface of the drain electrode 234. The pixel electrode 310 may be formed on the display area DA. For example, the pixel electrode 310 may be formed on the first organic insulating layer 122 that is disposed on the display area DA. The pixel electrode 310 may be electrically connected to the drain electrode 234 through the contact hole. For example, the pixel electrode 310 may include or may be formed of a metal, an alloy, a conductive metal nitride, a transparent conductive material, or the like.

Figure 12:
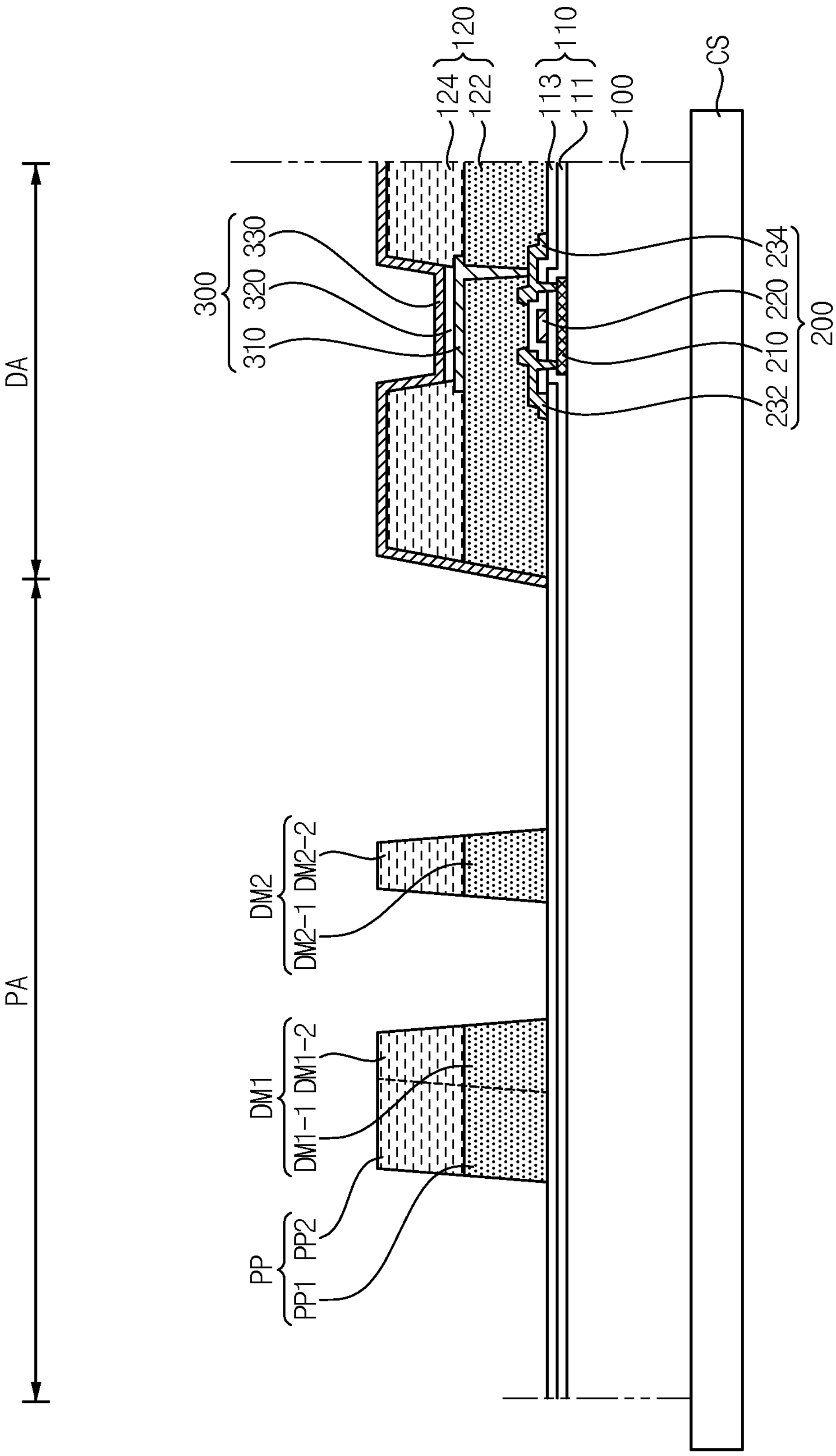

Referring to FIG. 12, the second organic insulating layer 124 may be formed on the display area DA, and may be disposed on the first organic insulating layer 122 that is disposed on the display area DA. The second organic insulating layer 124 may partially cover the pixel electrode 310 on the first organic insulating layer 122. The pixel opening exposing at least a portion of the pixel electrode 310 may be formed in the second organic insulating layer 124. For example, the pixel opening may penetrate the second organic insulating layer 124 to expose a portion of the pixel electrode 310.

The 1-2 dam DM1-2, the 2-2 dam DM2-2, and the second protrusion pattern PP2 may be formed on the peripheral area PA of the base substrate 100. For example, the 1-2 dam DM1-2 may be formed on the 1-1 dam DM1-1, and the 2-2 dam DM2-2 may be formed on the 2-1 dam DM2-1, and the second protrusion pattern PP2 may be formed on the first protrusion pattern PP1.

In an embodiment, the 2-2 dam DM2-2 may be positioned outside the second organic insulating layer 124 and spaced apart from the second organic insulating layer 124. In an embodiment, the 2-2 dam DM2-2 may have a closed loop shape, and the second organic insulating layer 124 may be disposed in a region encircled by the closed loop shape of the 2-2 dam DM2-2. The 1-2 dam DM1-2 may be positioned outside the 2-2 dam DM2-2 and spaced apart from the 2-2 dam DM2-2. In an embodiment, the 1-2 dam DM1-2 may have a closed loop shape, and the 2-2 dam DM2-2 may be disposed in a region encircled by the closed loop shape of the 1-2 dam DM1-2. The second protruding pattern PP2 may be positioned outside the 1-2 dam DM1-2 and integrally formed with the 1-2 dam DM1-2. For example, an outer sidewall of the 1-2 dam DM1-2 may contact the second protruding pattern PP2, and an inner side wall of the 1-2 dam DM1-2 may be adjacent to the 2-2 dam DM2-2. The inner sidewall of the 1-2 dam DM1-2 is opposite to the outer sidewall thereof.

In an embodiment, the second organic insulating layer 124, the 1-2 dam DM1-2, the 2-2 dam DM2-2, and the second protrusion pattern PP2 may be formed together. For example, by applying a second preliminary organic insulating layer on the base substrate 100 and patterning the second preliminary organic insulating layer, the second organic insulating layer 124, the 1-2 dam DM1-2, the 2-2 dam DM2-2, and the second protrusion pattern PP2 may be formed. The second organic insulating layer 124, the 1-2 dam DM1-2, the 2-2 dam DM2-2, and the second protrusion pattern PP2 may include or may be formed of an organic insulating material.

Accordingly, the first dam DM1, the second dam DM2, and the protrusion pattern PP may be formed on the peripheral area PA of the base substrate 100. The second dam DM2 may be spaced apart from the organic insulating layer 120. The first opening OP1 may be defined as a space between the second dam DM2 and the organic insulating layer 120. The first opening OP1 may separate the second dam DM2 from the organic insulating layer 120. The first dam DM1 may be spaced apart from the second dam DM2. The second opening OP2 may be defined as a space between the first dam DM1 and the second dam DM2. The second opening OP2 may separate the first dam DM1 from the second dam DM2. The protrusion pattern PP may be integrally formed with the first dam DM1. That is, the first dam DM1, the second dam DM2, and the protrusion pattern PP may be formed together with the organic insulating layer 120.

The light emitting layer 320 may be formed on the display area DA, and may be disposed on the pixel electrode 310 that is disposed on the display area DA. For example, the light emitting layer 320 may be formed on the pixel electrode 310 exposed by the pixel opening of the second organic insulating layer 124. The light emitting layer 320 may include or may be formed of at least one of selected from an organic light emitting material and a quantum dot.

The common electrode 330 may be formed on the display area DA, and may be disposed on the light emitting layer 320 that is disposed on the display area DA. For example, the common electrode 330 may be formed on the second organic insulating layer 124. In an embodiment, the common electrode 330 may be entirely formed on the second organic insulating layer 124.

Figure 13:
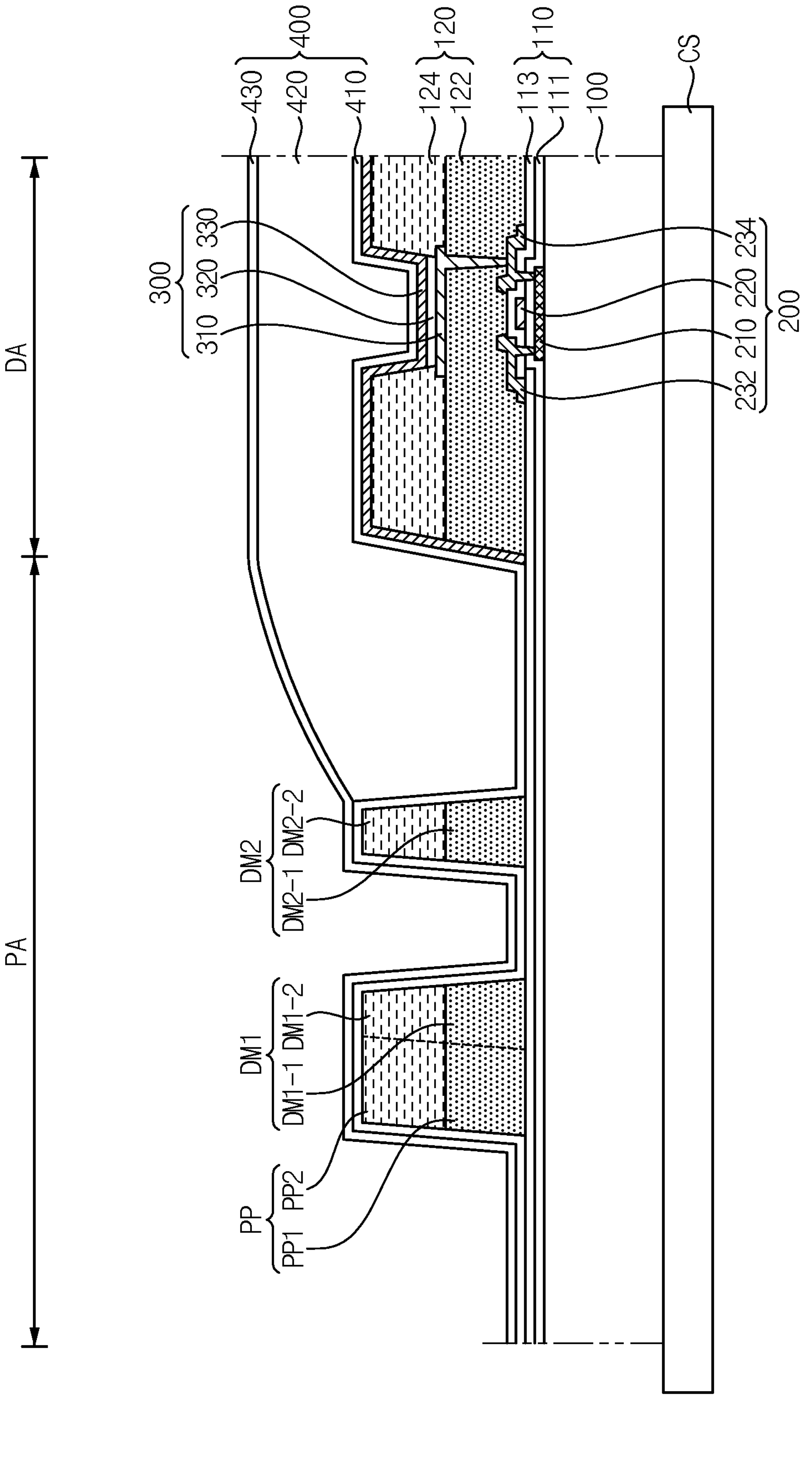

Referring to FIG. 13, the first inorganic encapsulation layer 410 may be formed on the interlayer insulating layer 113 and the common electrode 330. The first inorganic encapsulation layer 410 may cover the light emitting device 300 on the organic insulating layer 120. In an embodiment, the first inorganic encapsulation layer 410 may be formed on the display area DA and the peripheral area PA of the base substrate 100, and may be formed on the organic insulating layer 120 that is disposed on the display area DA. In an embodiment, the first inorganic encapsulation layer 410 may be entirely formed on the display area DA and the peripheral area PA of the base substrate 100, and may be entirely formed on the organic insulating layer 120 that is disposed on the display area DA. The first inorganic encapsulation layer 410 may include or may be formed of an inorganic insulating material.

The organic encapsulation layer 420 covering the display area DA may be formed on the first inorganic encapsulation layer 410. For example, the organic encapsulation layer 420 may include or may be formed of an organic material such as a transparent monomer.

The second inorganic encapsulation layer 430 may be formed on the organic encapsulation layer 420. In an embodiment, the second inorganic encapsulation layer 430 may be formed on the display area DA and the peripheral area PA of the base substrate 100. In an embodiment, the second inorganic encapsulation layer 430 may be entirely formed on the display area DA and the peripheral area PA of the base substrate 100. The second inorganic encapsulation layer 430 may include or may be formed of an inorganic insulating material.

Figure 14:
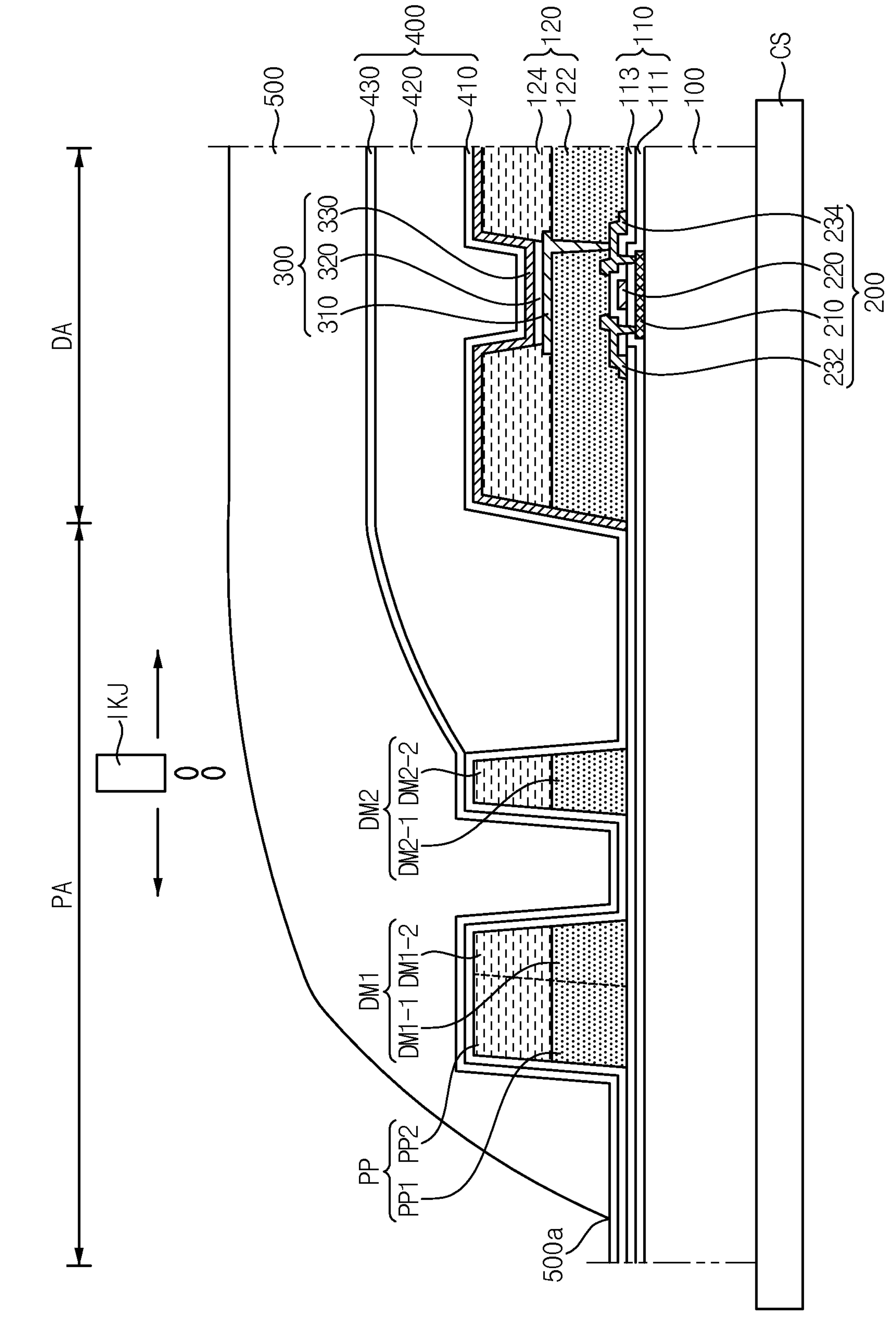

Referring to FIG. 14, the protective film 500 may be formed on the display area DA and the peripheral area PA of the base substrate 100. The protective film 500 may protect pre-formed lower structures until a subsequent process for forming an additional structure (e.g., a polarizer, etc.) on the encapsulation layer 400.

The protective film 500 may cover the protrusion pattern PP and the encapsulation layer 400. That is, an edge 500*a* of the protective film 500 may be positioned outside the protrusion pattern PP. In an embodiment, an inner sidewall of the protrusion pattern PP may contact DM1, and the edge 500*a* may be adjacent to an outer sidewall, opposite to the inner sidewall, of the protrusion pattern PP. The outer sidewall of the protrusion pattern PP may be disposed between the edge 500*a* and the inner sidewall of the protrusion pattern PP.

In an embodiment, the protective film 500 may be formed through an inkjet printing process. For example, the protective film 500 may be formed by applying a resin covering the protrusion pattern PP and the encapsulation layer 400 using an inkjet head IKJ located on the base substrate 100, and curing the resin.

Figure 15:
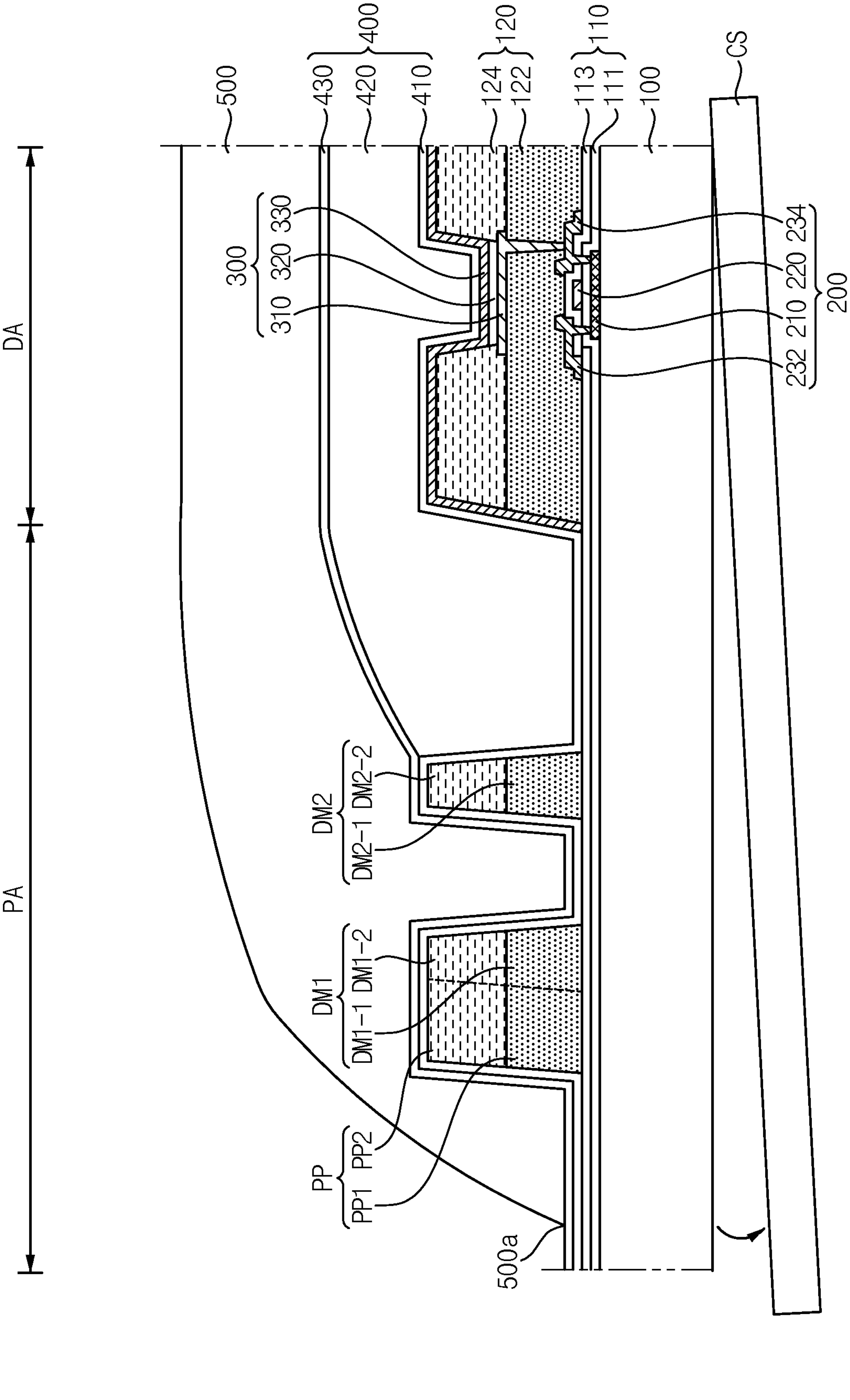

Referring to FIG. 15, the carrier substrate CS may be removed from the base substrate 100. In an embodiment, a bonding force between the carrier substrate CS and the base substrate 100 may be weakened by radiating a laser to the other surface opposite to one surface of the carrier substrate CS on which the base substrate 100 is disposed. Accordingly, the carrier substrate CS may be separated from the base substrate 100. However, this is only an example, and a method of removing the carrier substrate CS may be variously modified.

Referring to FIGS. 16 to 20, the protective film 500 may be removed. For example, before forming the additional structure (e.g., the polarizing plate, etc.) on the encapsulation layer 400, the protective film 500 may be removed from the base substrate 100.

Figure 16:
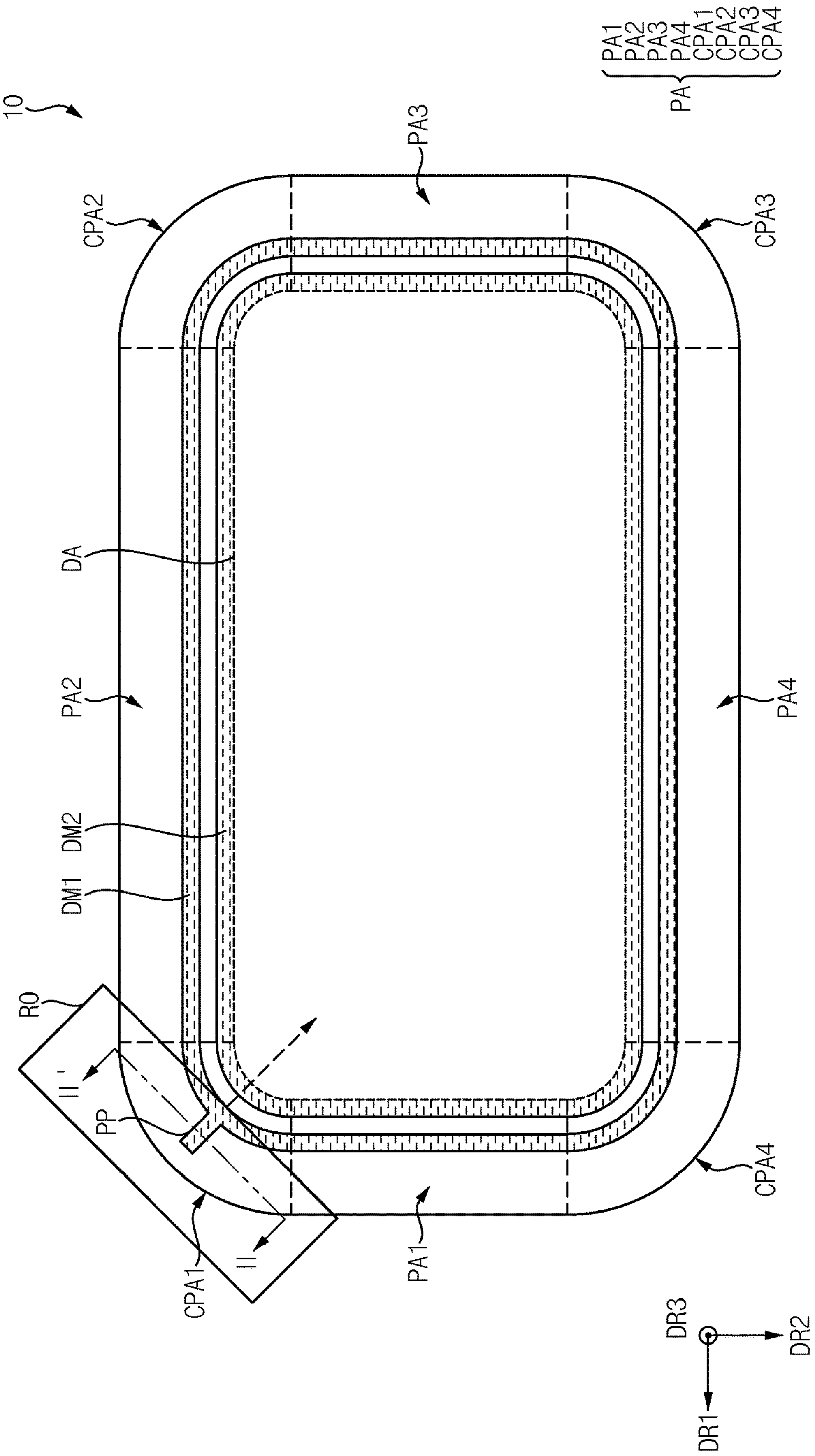
Figure 17:
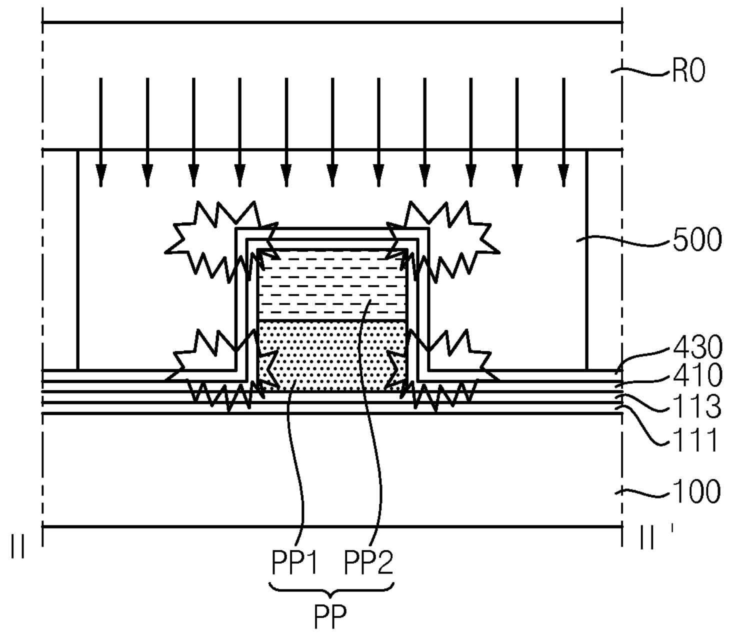
Figure 18:
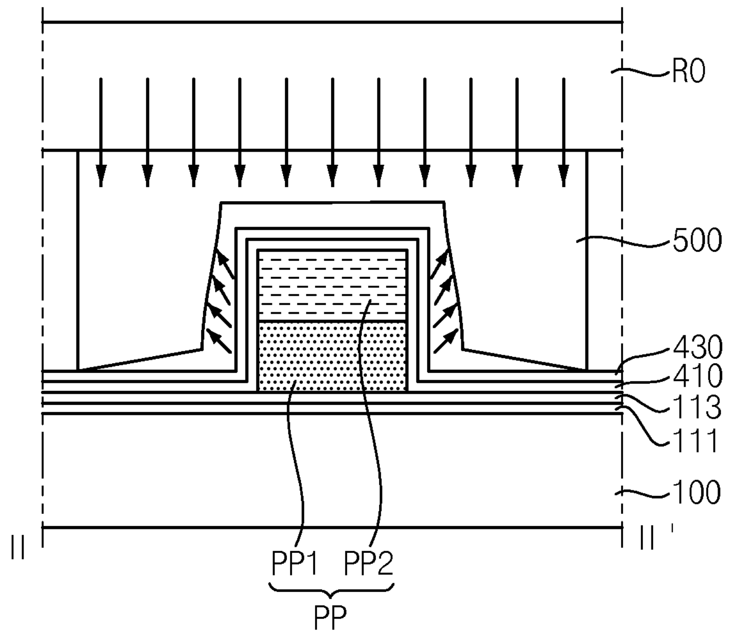

In an embodiment, the protective film 500 may be removed by an adhesive roller RO. For example, as shown in FIGS. 16 and 17, pressure may be applied around the edge 500*a* (see FIG. 15) of the protective film 500 from the third direction DR3 with the adhesive roller RO. Here, the adhesive roller RO may be positioned to overlap the protrusion pattern PP in a plan view. For example, the adhesive roller RO may be positioned to overlap the first corner peripheral area CPA1 of the display device 10, and pressure may be applied around the edge 500*a* of the protective film 500 with the adhesive roller RO. Accordingly, stress may be generated at the interface between the protective film 500 and the protrusion pattern PP by the pressure of the adhesive roller RO. Therefore, as shown in FIG. 18, deformation may be induced at the interface by the stress, and peeling around the edge 500*a* of the protective film 500 may occur. In an embodiment, a peeling off may start at the edge 500*a* adjacent to the protrusion pattern PP with deformation at the interface between the protective film 500 and the protrusion PP, and then the peeling off may propagate toward the center of the display area DA by rotatably moving the adhesive roller RO. In other words, rotatably moving of the adhesive roller RO may cause peeling off of a portion of the protective film 500 covering the protrusion pattern PP, and then a portion of the protective film 500 covering the encapsulation layer 400.

Figure 19:
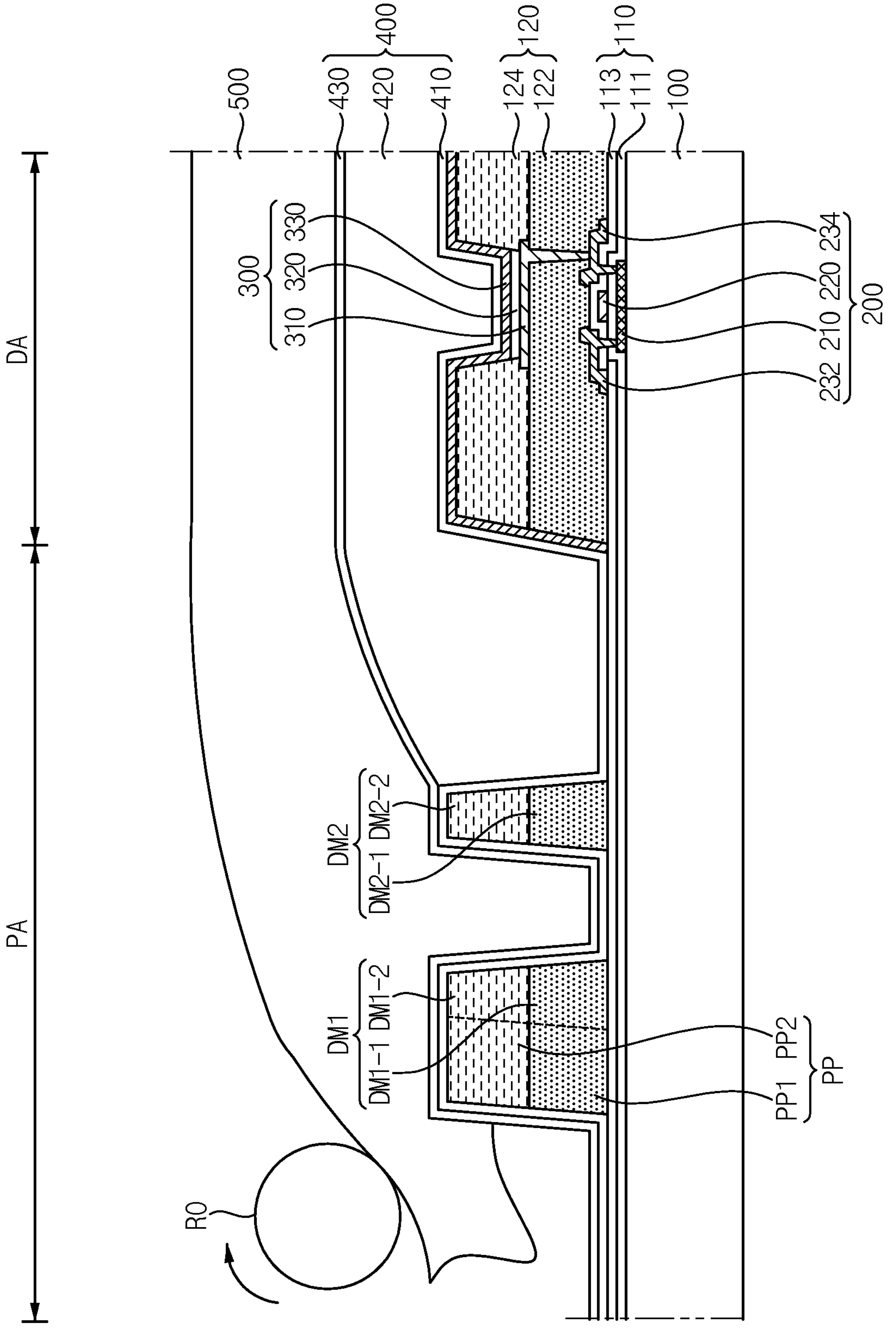
Figure 20:
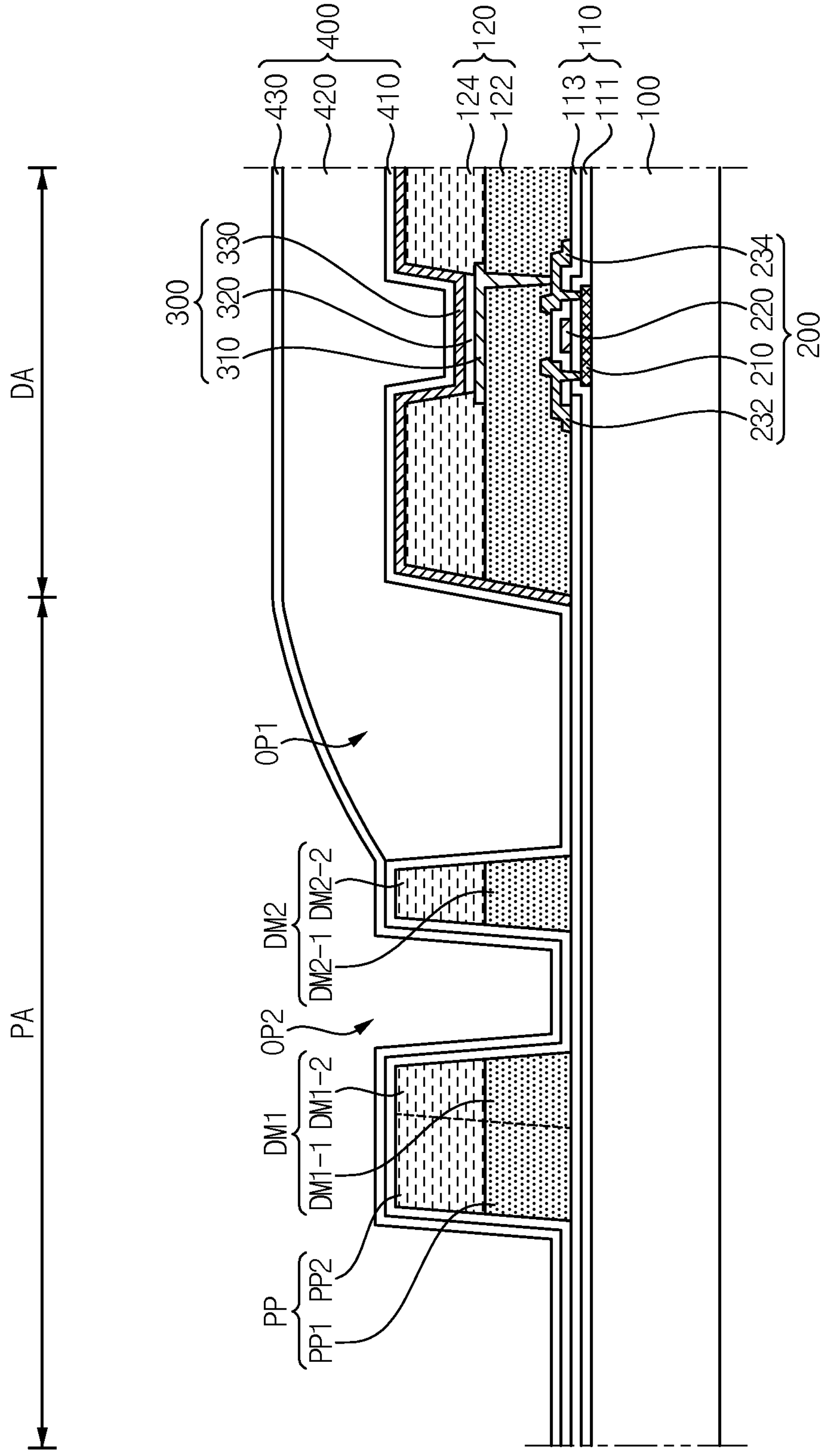

Then, as shown in FIGS. 16 and 19, the adhesive roller RO may rotatably move toward a center of the display device 10 (e.g., a center of the display area DA). Accordingly, a periphery of the edge 500*a* of the protective film 500 may be completely separated from the base substrate 100. As a result, as shown in FIG. 20, entire of the protective film 500 may be removed from the base substrate 100 by the adhesive roller RO.

According to embodiments, as the protective film 500 is formed after the protrusion pattern PP is formed, the protective film 500 may cover the protrusion pattern PP. That is, the edge 500*a* of the protective film 500 may be positioned outside the protrusion pattern PP. Accordingly, the interface between the protective film 500 and the protrusion pattern PP may be defined, and pressure may be applied to the protective film 500 by the adhesive roller RO to generate stress at the interface. Accordingly, deformation of the interface may be induced. Accordingly, the degree of peeling of the protective film 500 may be improved. Accordingly, the efficiency of the manufacturing process of the display device 10 may be improved.

Figure 21:
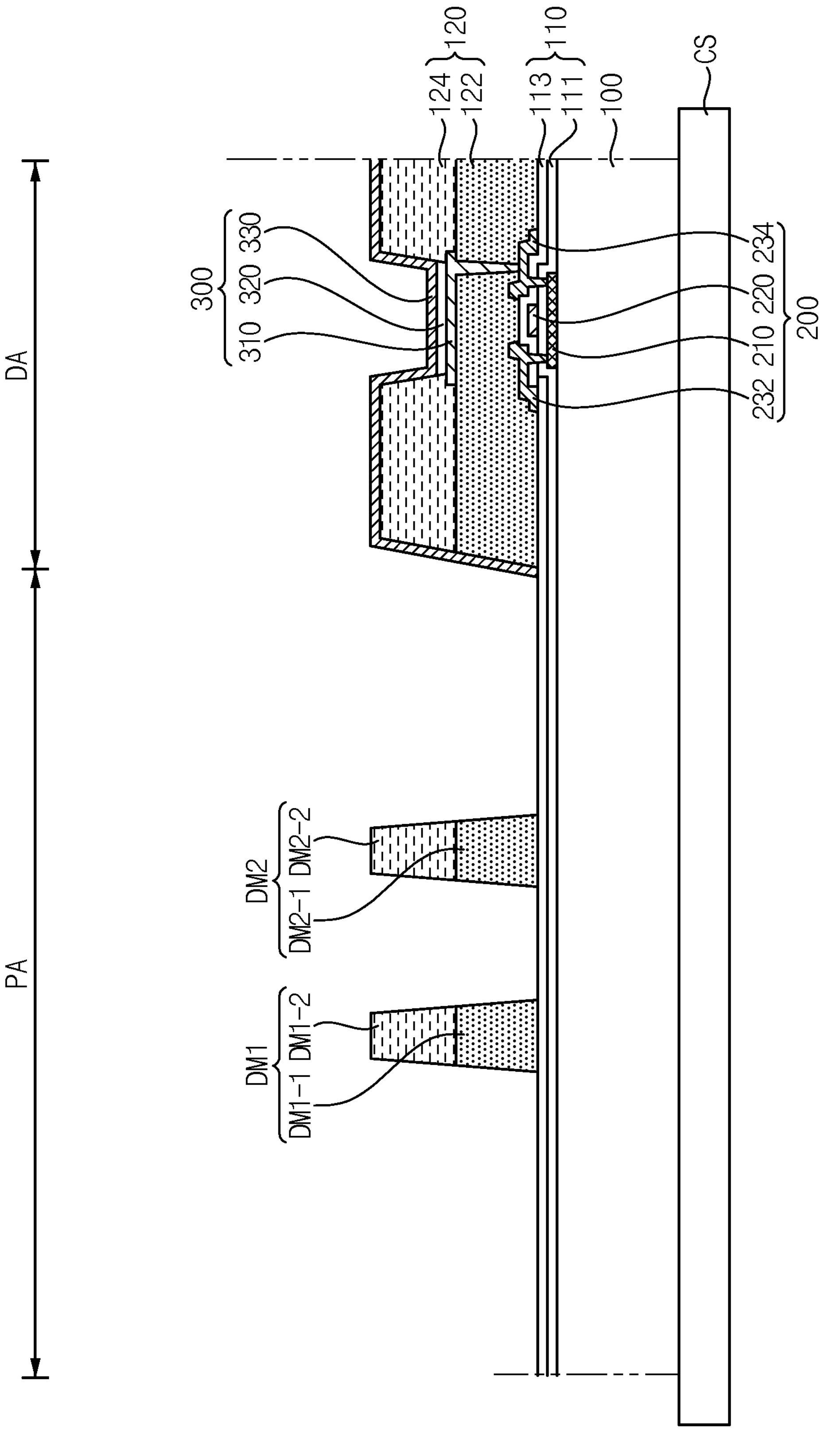
FIGS. 21 and 22 are cross-sectional views illustrating one step of a method of manufacturing a display device according to an embodiment.
Figure 22:
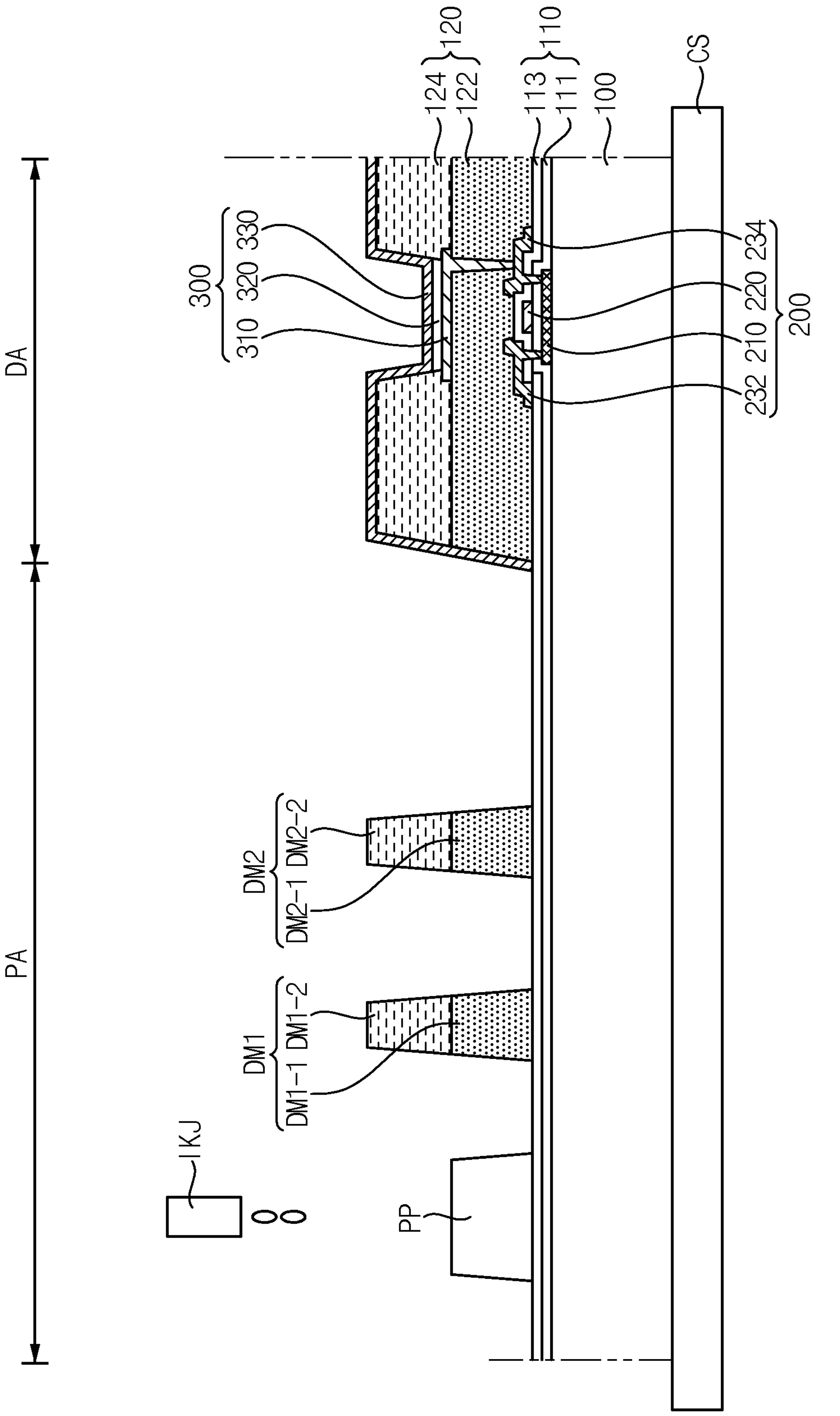

FIGS. 21 and 22 are cross-sectional views illustrating one step of a method of manufacturing a display device according to an embodiment. For example, FIGS. 21 and 22 are cross-sectional views illustrating a step of forming the protrusion pattern PP according to an embodiment.

A manufacturing method of the display device 10 according to an embodiment may be substantially same as the manufacturing method of the display device 10 as described above with reference to FIGS. 9 to 20 except for a method of forming the protrusion pattern PP. Therefore, hereinafter, only the method of forming the protrusion pattern PP according to an embodiment will be briefly described with reference to FIGS. 21 and 22.

Referring to FIG. 21, the organic insulating layer 120, the first dam DM1, and the second dam DM2 may be formed through the method as described above with reference to FIGS. 11 and 12. However, unlike FIGS. 11 and 12, in the manufacturing method of the display device 10 according to an embodiment, the protrusion pattern PP may not be formed with the organic insulating layer 120, the first dam DM1, and the second dam DM2. That is, the protrusion pattern PP may be formed through a separate process before or after the formation of the organic insulating layer 120, the first dam DM1, and the second dam DM2.

For example, referring to FIG. 22, the protrusion pattern PP may be formed through an inkjet printing process. That is, after the organic insulating layer 120, the first dam DM1, and the second dam DM2 are formed, the protrusion pattern PP may be formed by discharging a composition for the protrusion pattern by using the inkjet head IKJ. In an embodiment, the composition for the protrusion pattern may include or may be formed of an organic material.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a base substrate including a display area and a peripheral area positioned outside the display area;

an organic insulating layer disposed on the display area of the base substrate;

a light emitting device disposed on the organic insulating layer;

a first dam disposed on the peripheral area of the base substrate and spaced apart from the organic insulating layer; and a pattern disposed on the peripheral area of the base substrate and positioned outside a region enclosed by the first dam, wherein the pattern is integrally formed with the first dam and the pattern protrudes from an outer sidewall of the first dam.

2. The display device of claim 1, wherein the pattern is disposed on a same layer as the first dam.

3. The display device of claim 2, wherein the pattern includes an organic material.

4. The display device of claim 2, wherein the pattern includes a same material as the first dam.

5. The display device of claim 1, further comprising:

a second dam spaced apart from the first dam, wherein the first dam has a closed loop shape, and wherein the second dam is disposed in a region encircled by the closed loop shape of the first dam.

6. The display device of claim 1, wherein the peripheral area includes:

a first peripheral area extending along a first straight line extending in a first direction;

a second peripheral area extending along a second straight line extending in a second direction crossing the first direction; and a corner peripheral area connecting the first peripheral area to the second peripheral area, wherein the pattern is disposed on the corner peripheral area of the base substrate.

7. The display device of claim 1, wherein a planar shape of the pattern is one of a circle, an ellipse, a polygon, and a curved shape in a form of a fan-shaped arc.

8. The display device of claim 1, further comprising:

a first inorganic encapsulation layer disposed on the organic insulating layer and covering the light emitting device;

an organic encapsulation layer disposed on the first inorganic encapsulation layer, covering the display area, and positioned inside an inner region encircled by the first dam; and a second inorganic encapsulation layer disposed on the organic encapsulation layer, wherein the first inorganic encapsulation layer and the second inorganic encapsulation layer extend beyond the first dam from the inner region encircled by the first dam.

9. The display device of claim 8, wherein the first inorganic encapsulation layer and the second inorganic encapsulation layer cover the pattern.

10. The display device of claim 1, further comprising:

a first inorganic encapsulation layer disposed on the organic insulating layer and covering the light emitting device;

an organic encapsulation layer disposed on the first inorganic encapsulation layer, covering the display area, and positioned inside an inner region surrounded by the first dam; and a second inorganic encapsulation layer disposed on the organic encapsulation layer, wherein the first inorganic encapsulation layer and the second inorganic encapsulation layer extend to the first dam from the inner region encircled by the first dam, and wherein the pattern is exposed from the first inorganic encapsulation layer and the second inorganic encapsulation layer.

11. The display device of claim 1, wherein the pattern has a height having a value selected from a range of about 1 micrometer to about 15 micrometer.

12. A method of manufacturing a display device, the method comprising:

forming a base substrate including a display area and a peripheral area positioned outside the display area on a carrier substrate;

forming a pattern on the peripheral area of the base substrate;

forming a light emitting device on the peripheral area of the base substrate;

forming an encapsulation layer covering the light emitting device;

forming a protective film on the base substrate to cover the pattern and the encapsulation layer;

removing the carrier substrate from the base substrate; and removing the protective film disposed on the base substrate by peeling off a portion of the protective film covering the pattern and then peeling off another portion of the protective film covering the encapsulation layer.

13. The method of claim 12, further comprising:

forming an organic insulating layer on the display area of the base substrate; and forming a dam on the peripheral area of the base substrate, wherein the dam is spaced apart from the organic insulating layer, wherein the pattern is positioned outside a region encircled by the dam, and wherein the forming of the dam is performed simultaneously with the forming of the organic insulating layer.

14. The method of claim 13, wherein the forming of the pattern is simultaneously performed with the forming of the organic insulating layer and the forming of the dam.

15. The method of claim 12, wherein the pattern is formed by an inkjet printing process.

16. The method of claim 12, wherein the protective film is formed by an inkjet printing process.

17. A display device comprising:

a base substrate;

an organic insulating layer disposed on the base substrate;

a light emitting device disposed on the organic insulating layer;

a first dam encircling the organic insulating layer and spaced apart from the organic insulating layer;

a second dam disposed on the base substrate, wherein the second dam is encircled by the first dam, wherein the organic insulating layer is encircled by the second dam, and wherein the second dam is disposed between the first dam and the organic insulating layer; and a pattern disposed on the base substrate and adjacent to an outer sidewall of the first dam, wherein a portion of the first dam is disposed between the pattern and the second dam, wherein the pattern is integrally formed with the first dam and the pattern protrudes from the outer sidewall of the first dam.

* * * * *